United States Patent
Sawachi et al.

(10) Patent No.: US 10,533,916 B2
(45) Date of Patent: Jan. 14, 2020

(54) METHOD FOR INSPECTING FOR LEAKS IN GAS SUPPLY SYSTEM VALVES

(71) Applicant: TOKYO ELECTRON LIMITED, Tokyo (JP)

(72) Inventors: Atsushi Sawachi, Miyagi (JP); Norihiko Amikura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 207 days.

(21) Appl. No.: 15/739,027

(22) PCT Filed: Jul. 15, 2016

(86) PCT No.: PCT/JP2016/071054
§ 371 (c)(1),
(2) Date: Dec. 21, 2017

(87) PCT Pub. No.: WO2017/018257
PCT Pub. Date: Feb. 2, 2017

(65) Prior Publication Data
US 2018/0180509 A1    Jun. 28, 2018

(30) Foreign Application Priority Data

Jul. 29, 2015    (JP) .................. 2015-149699

(51) Int. Cl.
*G01M 3/28* (2006.01)
*C23C 16/455* (2006.01)
*H01L 21/67* (2006.01)
*H01J 37/32* (2006.01)

(52) U.S. Cl.
CPC ........ *G01M 3/2876* (2013.01); *C23C 16/455* (2013.01); *H01L 21/67017* (2013.01); *H01J 37/3244* (2013.01); *H01L 21/67069* (2013.01)

(58) Field of Classification Search
CPC ............... G01M 3/2876; C23C 16/455; H01L 21/67017
See application file for complete search history.

(56) References Cited

U.S. PATENT DOCUMENTS 6,170,496 B1 * 1/2001 Chen .................. B08B 5/02
134/102.1
9,349,619 B2 * 5/2016 Kawamata .......... H01L 21/3065
(Continued)

FOREIGN PATENT DOCUMENTS

JP    2013-051315 A    3/2013

OTHER PUBLICATIONS

International Search Report issued in PCT/JP2016/071054; dated Oct. 4, 2016.

*Primary Examiner* — John Fitzgerald
(74) *Attorney, Agent, or Firm* — Studebaker & Brackett PC

(57) ABSTRACT

Leaks in valves provided in a plurality of pipes connected to a plurality of gas sources are inspected. In a method of an embodiment, a first valve provided in a first pipe connected to a gas source is closed, and a second valve provided in a first pipe on a downstream side of the first valve is opened. A pressure increase is detected by a pressure gauge on a downstream side of the first pipe. In addition, the first valve is opened, and the second valve is closed. A pressure increase is detected by a pressure gauge on a downstream side of the first pipe.

5 Claims, 10 Drawing Sheets

(56) References Cited

U.S. PATENT DOCUMENTS

| | | | |
|---|---|---|---|
| 2014/0193977 A1* | 7/2014 | Kawamata | H01L 21/3065 438/710 |
| 2015/0187567 A1* | 7/2015 | Ashihara | H01L 21/02104 438/758 |
| 2016/0099161 A1* | 4/2016 | Kawamata | H01L 21/3065 438/710 |

* cited by examiner

METHOD FOR INSPECTING FOR LEAKS IN GAS SUPPLY SYSTEM VALVES

TECHNICAL FIELD

An embodiment of the present invention relates to a method for inspecting leaks in valves of a gas supply system for supplying a gas to a processing container of a substrate processing apparatus.

BACKGROUND ART

In the manufacturing of an electronic device such as a semiconductor device, substrate processing is performed using a substrate processing apparatus. As processing performed in the substrate processing apparatus, for example, plasma processing in which etching or film formation is performed using a plasma may be performed.

In a process in such a substrate processing apparatus, different types of processing may be performed on a substrate by sequentially changing gases which are supplied into the same processing container. In order to perform such a process, a substrate processing apparatus is required to include a gas supply system capable of switching different gases to be supplied. As a substrate processing apparatus including such a gas supply system, a plasma processing apparatus is disclosed in the following Patent Literature 1.

The gas supply system of the plasma processing apparatus disclosed in Patent Literature 1 includes a plurality of pipes connected to a plurality of gas sources, a single common pipe connected to the plurality of pipes, and a plurality of branch pipes branching off from the common pipe. A valve is provided in each of the plurality of pipes. A flow rate controller and a valve are provided in each of the plurality of branch pipes. According to the gas supply system, a gas selected among the plurality of gas sources can be supplied to the plasma processing apparatus through the plurality of branch pipes by selectively opening and closing the valves of the plurality of pipes.

CITATION LIST

Patent Literature

[Patent Literature 1] Japanese Patent Application Laid-Open publication No. 2013-51315

SUMMARY OF INVENTION

Technical Problem

The plurality of gas sources connected to the plurality of pipes of the above-described gas supply system are gas sources which are not assumed to be used simultaneously. Therefore, in a case where leaks in the valves of the plurality of pipes occur, undesirable mixture of gases occurs, which causes an adverse influence on substrate processing. In addition, in a case where leaks occur in the valves of the plurality of pipes, a gas may flow backward from a side of the processing container of the substrate processing apparatus to the gas sources.

Therefore, it is necessary to inspect leaks in valves of the gas supply system for supplying a gas to the processing container of the substrate processing apparatus, particularly, valves provided in the plurality of pipes connected to the plurality of gas sources.

Solution to Problem

In an aspect, there is provided a method for inspecting leaks in valves of a gas supply system for supplying a gas to a processing container of a substrate processing apparatus. The gas supply system include a plurality of first pipes, a plurality of first valves, a plurality of second valves, a second pipe, a third pipe, a plurality of fourth pipes, a plurality of flow rate controllers, a plurality of third valves, an exhaust pipe, a fourth valve, and a fifth pipe. The plurality of first pipes are connected to a plurality of gas sources, respectively. The plurality of first valves are provided in a plurality of first pipes, respectively. The plurality of second valves are provided in the plurality of first pipes on downstream sides with respect to the plurality of first valves, respectively. That is, each of the plurality of first pipes is provided with the first valve and the second valve arranged in order from the gas source side in series. The second pipe is connected to the plurality of first pipes on downstream sides of the plurality of second valves. The third pipe is connected to the second pipe. The plurality of fourth pipes branch off from the third pipe. The plurality of flow rate controllers are provided in the plurality of fourth pipes, respectively. The plurality of third valves are provided in the plurality of fourth pipes on downstream sides of the plurality of flow rate controllers, respectively. That is, each of the plurality of fourth pipes is provided with the flow rate controller and the third valve arranged in order from the third pipe side in series. The exhaust pipe is connected to an exhaust apparatus. The fourth valve is provided in the exhaust pipe. The fifth pipe is connected to the exhaust pipe on an upstream side of the exhaust apparatus and the fourth valve, and is connected to the second pipe. The method includes (i) a first step of performing evacuation of insides of the plurality of first pipes, an inside of the second pipe, an inside of the third pipe, and insides of the plurality of fourth pipes, an exhaust state being formed in which respective control valves of the plurality of flow rate controllers, the plurality of second valves, and the fourth valve are opened, and the plurality of first valves and the plurality of third valves are closed, (ii) a second step of forming a first inspection state in which the plurality of first valves, the plurality of third valves, and the fourth valve are closed, and one or more second valves among the plurality of second valves or the plurality of second valves are opened, (iii) a third step of monitoring a pressure increase using a pressure gauge provided in the exhaust pipe on an upstream side of the exhaust apparatus and the fourth valve, or a pressure gauge of one flow rate controller among the plurality of flow rate controllers, (iv) a fourth step of forming a second inspection state in which the plurality of second valves, the plurality of third valves, and the fourth valve are closed, and one or more first valves provided on an upstream side of the one or more second valves among the plurality of first valves or the plurality of first valves are opened, and (v) a fifth step of monitoring a pressure increase using the pressure gauge provided in the exhaust pipe on the upstream side of the exhaust apparatus and the fourth valve, or a pressure gauge of one flow rate controller among the plurality of flow rate controllers.

According to the method, in a case where a leak occurs in a first valve located on an upstream side of the second valve which is opened in the first inspection state, a pressure increase is detected by the pressure gauge. In addition, in a case where a leak occurs in a second valve located on a downstream side of the first valve which is opened in the second inspection state, a pressure increase is detected by the pressure gauge. Therefore, it is possible to detect the occurrence of a leak in any of the plurality of first valves and the occurrence of a leak in any of the plurality of second valves.

In an embodiment, the plurality of second valves may be opened in the first inspection state formed in the second step, and the plurality of first valves may be opened in the second inspection state formed in the fourth step.

The method of an embodiment further includes a step of inspecting a leak in a first valve which is a target for inspection to be selected in order from the plurality of first valves, in a case where a pressure increase is detected in the third step. This step includes monitoring a pressure increase using the pressure gauge provided in the exhaust pipe on the upstream side of the exhaust apparatus and the fourth valve, or a pressure gauge of one flow rate controller among the plurality of flow rate controllers, in a state where the plurality of first valves, the plurality of third valves, the fourth valve, and second valves other than a second valve provided on a downstream side of the first valve which is a target for inspection among the plurality of second valves are closed. According to the embodiment, in a case where a pressure increase is detected in the third step by a leak occurring in any of the plurality of first valves, it is possible to individually detect leaks in the plurality of first valves.

The method of the embodiment further include a step of inspecting a leak in a second valve which is a target for inspection to be selected in order from the plurality of second valves, in a case where a pressure increase is detected in the fifth step. This step includes monitoring a pressure increase using the pressure gauge provided in the exhaust pipe on the upstream side of the exhaust apparatus and the fourth valve, or a pressure gauge of one flow rate controller among the plurality of flow rate controllers, in a state where the plurality of second valves, the plurality of third valves, the fourth valve, and first valves other than a first valve provided on an upstream side of the second valve which is a target for inspection among the plurality of first valves are closed. According to the embodiment, in a case where a pressure increase is detected in the fifth step by a leak occurring in any of the plurality of second valves, it is possible to individually detect leaks in the plurality of second valves.

In an embodiment, the gas supply system includes a plurality of other first pipes, a plurality of other first valves, a plurality of other second valves, an other second pipe, an other third pipe, a plurality of other fourth pipes, a plurality of other flow rate controllers, a plurality of other third valves, an other fifth pipe, a fifth valve, and an other fifth valve. The plurality of other first pipes are connected to a plurality of other gas sources, respectively. The plurality of other first valves are provided in a plurality of other first pipes, respectively. The plurality of other second valves are provided in the plurality of other first pipes on downstream sides with respect to the plurality of other first valves, respectively. That is, each of the plurality of other first pipes is provided with the other first valve and the other second valve in order from the gas source side in series. The other second pipe is connected to the plurality of other first pipes on downstream sides of the plurality of other second valves. The other third pipe is connected to the other second pipe. The plurality of other fourth pipes branch off from the other third pipe. The plurality of other flow rate controllers are provided in the plurality of other fourth pipes, respectively. The plurality of other third valves are provided in the plurality of other fourth pipes on downstream sides of the plurality of other flow rate controllers, respectively. That is, each of the plurality of other fourth pipes is provided with the other flow rate controller and the other third valve in order from the other third pipe side in series. The other fifth pipe is connected to the exhaust pipe on the upstream side of the exhaust apparatus and the fourth valve, and is connected to the other second pipe. The fifth valve is provided in the fifth pipe. In addition, the other fifth valve is provided in the other fifth pipe. The method of the embodiment further includes a step of supplying a gas from one or more gas sources among the plurality of other gas sources to the substrate processing apparatus, in a state where the other fifth valve is closed. In addition, in the embodiment, during the execution of the step of supplying a gas to the substrate processing apparatus, the first step, the second step, the third step, the fourth step, and the fifth step are executed. According to the embodiment, during a process of the substrate processing apparatus, it is possible to inspect leaks in a first valve and a second valve provided in a first pipe for a gas which is not used in the process.

Advantageous Effects of Invention

As described above, it is possible to inspect leaks in valves provided in a plurality of pipes connected to a plurality of gas sources.

DESCRIPTION OF EMBODIMENTS

Hereinafter, various embodiments will be described in detail with reference to the accompanying drawings. In the respective drawings, the same or equivalent portions are denoted by the same reference symbols.

First, several embodiment of a gas supply system to which methods for inspecting for leaks in gas supply system valves according to several embodiments can be applied, and embodiments of a substrate processing apparatus including the gas supply system will be described.

Figure 1:
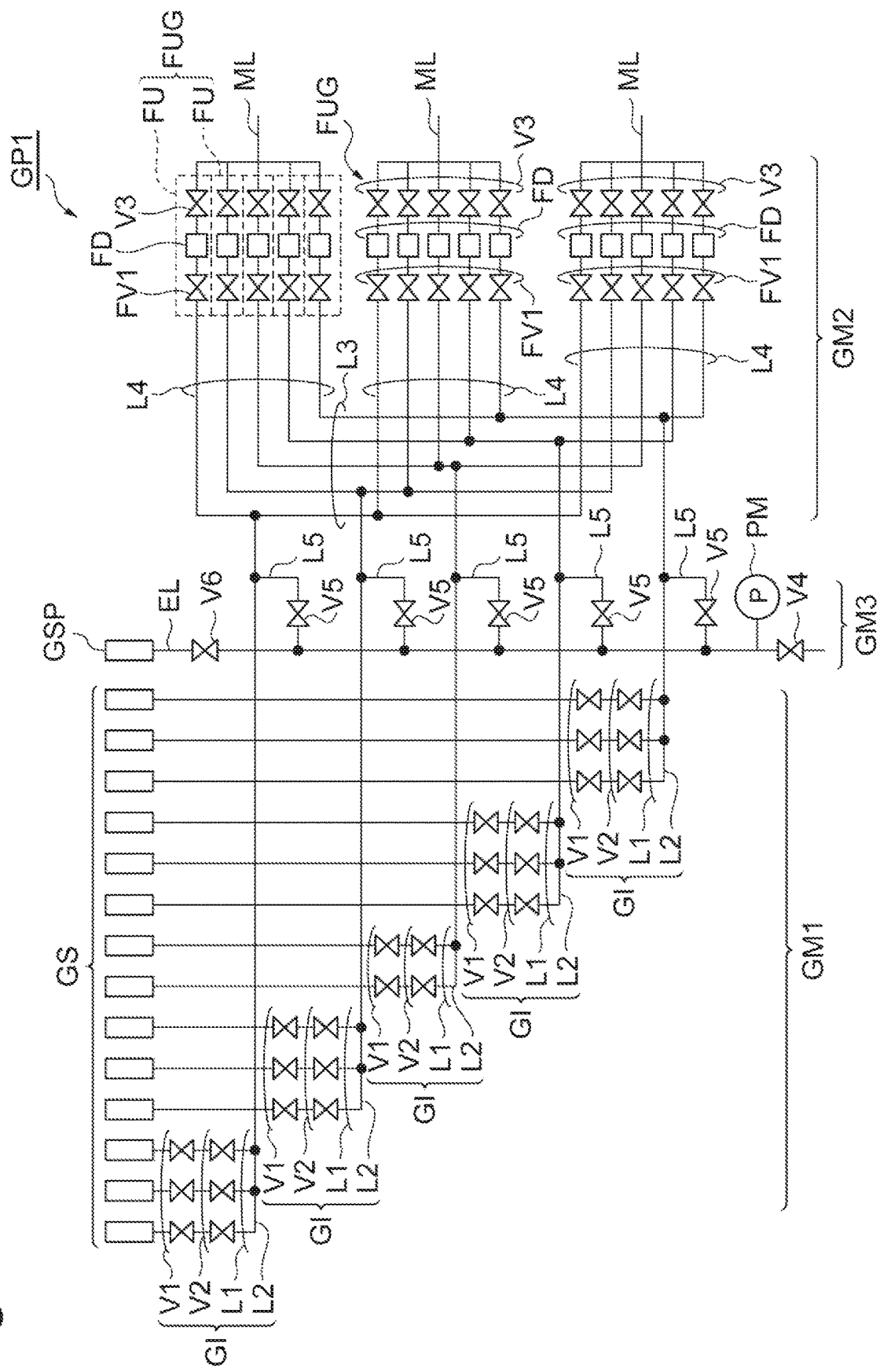
FIG. 1 is a diagram illustrating a gas supply system according to an embodiment.

FIG. 1 is a diagram illustrating a gas supply system according to an embodiment. A gas supply system GP1 shown in FIG. 1 includes a first mechanism GM1, a second mechanism GM2, and a third mechanism GM3.

The first mechanism GM1 includes a plurality of integration portions GI. In the present embodiment, the first mechanism GM1 includes five integration portions GI. However, the number of integration portions GI is arbitrary. The first mechanism GM1 is configured to output a gas selected in each of the plurality of integration portions GI from an individual pipe.

The first mechanism GM1 includes a plurality of first pipes L1, a plurality of first valves V1, a plurality of second valves V2, and a plurality of second pipes L2. The plurality of first pipes L1 are connected to a plurality of gas sources GS, respectively. The plurality of first pipes L1 are provided with the plurality of first valves V1, respectively. In addition, the plurality of first pipes L1 are provided with the plurality of second valves V2 on downstream sides of the plurality of first valves V1, respectively. That is, each of the plurality of first pipes L1 is provided with the first valve V1 and the second valve V2 arranged in series in order from the upstream side (gas source side). In FIG. 1, fourteen gas sources GS are shown, but the number of gas sources GS is arbitrary.

Each of the plurality of integration portions GI includes one second pipe L2, the first pipes L1 connected to the one second pipe L2, and the first valve V1 and the second valve V2 provided in each of the plurality of first pipes L1. A plurality of gas sources which are not used simultaneously in a process performed in the substrate processing apparatus are connected to each integration portion GI. Each of the integration portions GI can supply a gas from a gas source selected among a plurality of gas sources GS connected to the integration portion GI.

The second mechanism GM2 is configured to distribute a plurality of gases from the plurality of integration portions GI, and to adjust the flow rates of the distributed gases to output them. The second mechanism GM2 includes a plurality of third pipes L3, a plurality of fourth pipes L4, a plurality of flow rate controllers FD, and a plurality of third valves V3. In an embodiment, the second mechanism GM2 may further include a plurality of valves FV1.

The plurality of third pipes L3 are connected to the plurality of second pipes L2, respectively. The fourth pipes L4 branch off from each of the plurality of third pipes. The plurality of flow rate controllers FD are provided in the plurality of fourth pipes L4, respectively. The plurality of third valves V3 are provided in the plurality of fourth pipes L4 on downstream sides of the plurality of flow rate controllers FD, respectively. In addition, the plurality of valves FV1 are provided in the plurality of fourth pipes L4 on upstream sides of the plurality of flow rate controllers FD, respectively.

Figure 2:
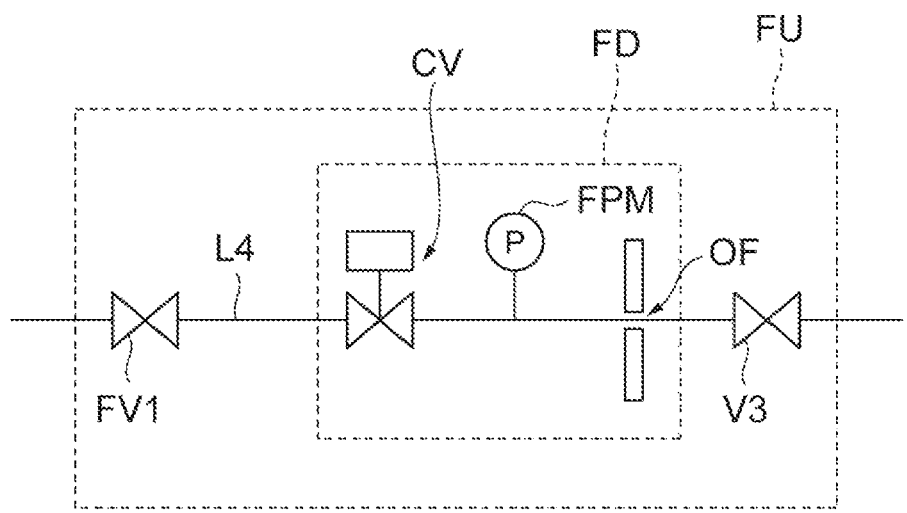
FIG. 2 is a diagram illustrating a configuration of a pressure control-type flow rate controller.

In an embodiment, the plurality of flow rate controllers FD are pressure control-type flow rate controllers. FIG. 2 is a diagram illustrating a configuration of a pressure control-type flow rate controller. The flow rate controller FD shown in FIG. 2 includes a control valve CV, a pressure gauge FPM, and an orifice OF. The control valve CV is provided on a downstream side of the valve FYI. The orifice OF is provided on a downstream side of the control valve CV and on an upstream side of the third valve V3. In addition, the pressure gauge FPM is configured to measure a pressure in a gas line between the control valve CV and the orifice OF. The flow rate controller FD controls the control valve CV in accordance with the pressure measured by the pressure gauge FPM, to thereby adjust the pressure of a gas line on an upstream side of the orifice OF. Accordingly, the flow rate of a gas passing through the flow rate controller FD is adjusted.

Reference is made to FIG. 1 again. As shown in FIG. 1, in an embodiment, the second mechanism GM2 further includes a plurality of merging pipes ML. The number of merging pipes ML is the same as the number of gas delivery portions of a plasma processing apparatus described later which is an example of the substrate processing apparatus. One fourth pipe L4 among the plurality of fourth pipes L4 connected to each of the third pipes L3 is connected to each of the plurality of merging pipes ML.

In addition, the second mechanism GM2 provides a plurality of flow rate control units groups FUG. Each of the plurality of flow rate control units groups FUG includes a plurality of flow rate control units FU which are respectively provided in the plurality of fourth pipes L4 connected to one corresponding merging pipe ML. Each of the plurality of flow rate control units FU includes a flow rate controller FD provided in one fourth pipe L4, a valve FV1 provided on an upstream side of the flow rate controller FD, and a third valve V3 provided on a downstream side of the flow rate controller FD. The number of flow rate control units groups FUG is the same as the number of gas delivery portions described later. In the example shown in FIG. 1, the number of flow rate control units groups FUG is three. However, in a case where the number of flow rate control unit groups FUG and the number of gas delivery portions are plural, these numbers can be set to arbitrary numbers.

In such a second mechanism GM2, a gas from each of the plurality of third pipes L3 is distributed to the plurality of flow rate control units groups FUG, and is supplied to a corresponding flow rate control unit FU of each flow rate control unit group FUG. In each flow rate control unit group FUG, a corresponding flow rate control unit FU is configured to adjust the flow rate of a gas, and to supply the gas of which the flow rate is adjusted to the merging pipe ML.

The third mechanism GM3 is an exhaust mechanism of the gas supply system GP1. The third mechanism GM3 includes an exhaust pipe EL, a fourth valve V4, a plurality of fifth pipes L5, a plurality of fifth valves, and a valve V6.

The exhaust pipe EL is provided with the fourth valve V4 and the valve V6. The fourth valve V4 is provided on a downstream side in the exhaust pipe EL, and the valve V6 is provided on an upstream side in the exhaust pipe EL. The exhaust pipe EL is connected to a source GSP of a purge gas on an upstream side of the valve V6. The purge gas is an inert gas such as, for example, a $N_2$ gas. In addition, the exhaust pipe EL is connected to an exhaust apparatus on a downstream side of the fourth valve V4. In an embodiment, the exhaust pipe EL is connected to a pipe between a turbo-molecular pump and a dry pump of a plasma processing apparatus described later. In the plasma processing apparatus, the turbo-molecular pump may be connected to a processing container, and the dry pump may be provided on a downstream side of the turbo-molecular pump, as described later.

One end of the plurality of fifth pipes L5 is connected to the exhaust pipe EL between the valve V6 and the fourth valve V4. In addition, the other end of each of the plurality of fifth pipes L5 is connected to a corresponding second pipe L2. The plurality of fifth pipes L5 are provided with a plurality of fifth valves V5, respectively.

In an embodiment, a pressure gauge PM is connected to the exhaust pipe EL between the valve V6 and the fourth valve V4. The pressure gauge PM is configured to measure the pressure of a flow channel within the exhaust pipe EL.

According to such a gas supply system GP1, a desired gas can be output from the plurality of merging pipes ML to the substrate processing apparatus by closing the valve V6, the fourth valve V4, and the plurality of fifth valves V5, opening the first valve V1 and the second valve V2 provided in one desired first pipe L1 among the plurality of first pipes L1 of each integration portion GI, and adjusting a flow rate in a corresponding flow rate control unit FU of each of the plurality of flow rate control units groups FUG Next, in a case where a gas supplied from the gas supply system GP1 to the substrate processing apparatus is changed, gases remaining in the plurality of first pipes L1, the plurality of second pipes L2, the plurality of third pipes L3, and the plurality of fourth pipes can be rapidly exhausted by closing all the first valves V1, all the second valves V2, and the plurality of third valves V3, and opening the valve V6, the fourth valve V4, all the fifth valves V5, and the control valves CV of the plurality of flow rate controllers FD.

Next, a desired gas can be output from the plurality of merging pipes ML to the substrate processing apparatus by closing the valve V6, the fourth valve V4, and all the fifth valves V5, opening first valve V1 and the second valve V2 provided in one desired first pipe L1 among the plurality of first pipes L1 of each integration portion GI, and adjusting a flow rate in a corresponding flow rate control unit FU of each of the plurality of flow rate control units groups FUG In this manner, the gas supply system GP1 can exhaust a gas inside a flow channel within the gas supply system GP1 rapidly, that is, in a short period of time, and replace the exhausted gas by another gas.

Figure 3:
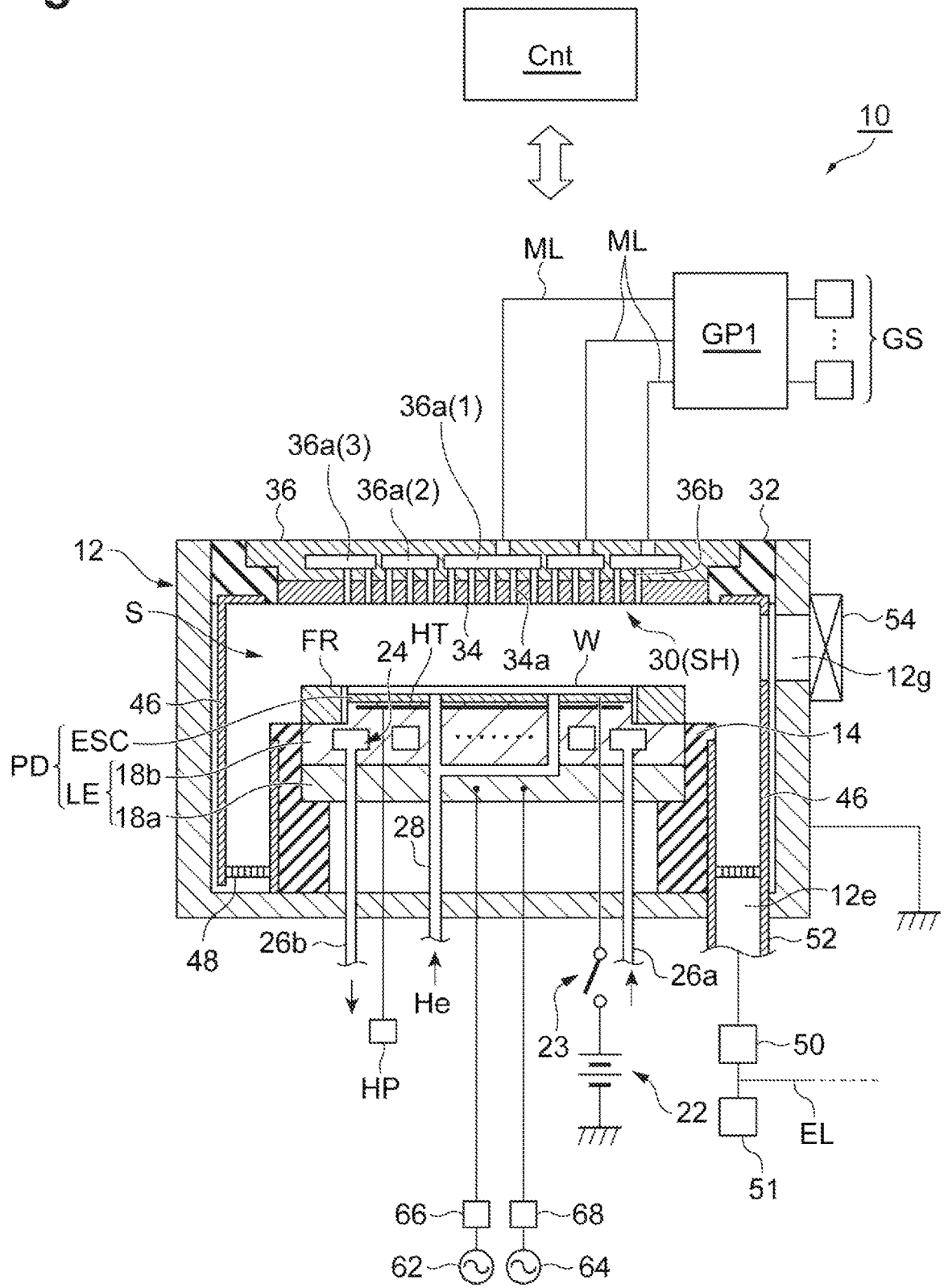
FIG. 3 is a diagram schematically illustrating a plasma processing apparatus according to an embodiment.

Hereinafter, a description will be given of a plasma processing apparatus of an embodiment, as the substrate processing apparatus including the gas supply system GP1. FIG. 3 is a diagram schematically illustrating a plasma processing apparatus according to an embodiment. A plasma processing apparatus 10 shown in FIG. 3 is a capacitive coupling type plasma processing apparatus, and is an apparatus which is used for plasma etching, for example, as plasma processing.

The plasma processing apparatus 10 includes the processing container 12. The processing container 12 has a substantially cylindrical shape. The processing container 12 is formed of, for example, aluminum, and has anodic oxidation performed on the inner wall surface thereof. This processing container 12 is grounded for safety. In addition, a transfer-in/out port 12g for a substrate (hereinafter, referred to as a "wafer W") is provided in the sidewall of the processing container 12, and the transfer-in/out port 12g is configured to be capable of being opened and closed by a gate valve 54.

A support portion 14 of a substantially cylindrical shape is provided on the bottom of the processing container 12. The support portion 14 is formed of, for example, an insulating material. The support portion 14 extends from the bottom of the processing container 12 in a vertical direction, within the processing container 12. In addition, a mounting pedestal PD is provided within the processing container 12. The mounting pedestal PD is supported by the support portion 14.

The mounting pedestal PD holds the wafer W on the upper surface thereof. The mounting pedestal PD includes a lower electrode LE and an electrostatic chuck ESC. The lower electrode LE includes a first plate 18a and a second plate 18b. The first plate 18a and the second plate 18b are formed of a metal such as, for example, aluminum, and have a substantially discoid shape. The second plate 18b is provided on the first plate 18a, and is electrically connected to the first plate 18a.

The electrostatic chuck ESC is provided on the second plate 18b. The electrostatic chuck ESC has a structure in which an electrode which is a conductive film is disposed between a pair of insulating layers or insulating sheets. A direct-current power source 22 is electrically connected to the electrode of the electrostatic chuck ESC through a switch 23. This electrostatic chuck ESC attracts the wafer W using an electrostatic force such as a Coulomb's force generated by a direct-current voltage from the direct-current power source 22. Accordingly, the electrostatic chuck ESC can hold the wafer W.

A focus ring FR is disposed on the peripheral portion of the second plate 18b so as to surround the edge of the wafer W and the electrostatic chuck ESC. The focus ring FR is provided in order to improve the uniformity of plasma processing. The focus ring FR may be formed of a material such as, for example, silicon, quartz, or SiC.

A refrigerant flow channel 24 is provided within the second plate 18b. The refrigerant flow channel 24 configures a temperature-adjusting mechanism. A refrigerant is supplied to the refrigerant flow channel 24 from a chiller unit provided outside the processing container 12 through a pipe 26a. The refrigerant supplied to the refrigerant flow channel 24 is returned to the chiller unit through a pipe 26b. In this manner, the refrigerant is supplied to the refrigerant flow channel 24 so as to be circulated. The temperature of the wafer W supported by the electrostatic chuck ESC is controlled by controlling the temperature of the refrigerant.

In addition, the plasma processing apparatus 10 is provided with a gas supply line 28. The gas supply line 28 supplies a heat-transfer gas from a heat-transfer gas supply mechanism, for example, a He gas between the upper surface of the electrostatic chuck ESC and the rear surface of the wafer W.

In addition, the plasma processing apparatus 10 is provided with a heater HT which is a heating element. The heater HT is buried within, for example, the second plate 18b. A heater power source HP is connected to the heater HT. By supplying power supplied from the heater power source HP to the heater HT, the temperature of the mounting pedestal PD is adjusted, and the temperature of the wafer W placed on the mounting pedestal PD is adjusted. The heater HT may be built into the electrostatic chuck ESC.

In addition, the plasma processing apparatus 10 includes an upper electrode 30. The upper electrode 30 is disposed above the upper portion of the mounting pedestal PD so as to face the mounting pedestal PD. The lower electrode LE and the upper electrode 30 are provided substantially in parallel to each other. A processing space S for performing plasma processing on the wafer W is provided between the upper electrode 30 and the mounting pedestal PD.

The upper electrode 30 is supported on the upper portion of the processing container 12 with an insulating shielding member 32 interposed therebetween. In an embodiment, the upper electrode 30 may be configured such that a distance in a vertical direction from the upper surface of the mounting pedestal PD, that is, a wafer placement surface is variable. The upper electrode 30 may include a top plate 34 and a support 36. The top plate 34 faces the processing space S, and the top plate 34 is provided with a plurality of gas delivery holes 34a. This top plate 34 may be formed of silicon or a silicon oxide. Alternatively, the top plate 34 may be formed by coating a conductive (for example, aluminum) base material with ceramics.

The support 36 detachably supports the top plate 34, and may be formed of a conductive material such as, for example, aluminum. This support 36 may have a water-cooling structure. A plurality of gas diffusion chambers 36a are provided within the support 36. The plurality of gas diffusion chambers 36a are concentrically provided around an axis extending in a vertical direction through the center of the wafer W, that is, the center of the mounting pedestal PD. As shown in FIG. 3, the plurality of merging pipes ML of the gas supply system GP1 are connected to the plurality of gas diffusion chambers 36a, respectively.

In the example shown in FIG. 3, the plurality of gas diffusion chambers 36a includes three gas diffusion chambers, that is, a gas diffusion chamber 36a(1), a gas diffusion chamber 36a(2), and a gas diffusion chamber 36a(3). The gas diffusion chamber 36a(1) is provided on the above-described axis, and can have a planar shape which is circular when seen from a vertical direction. The gas diffusion chamber 36a(2) extends annularly on the outside of the gas diffusion chamber 36a(1). In addition, the gas diffusion chamber 36a(3) extends annularly on the outside of the gas diffusion chamber 36a(2).

As shown in FIG. 3, a plurality of communication holes are formed in the support 36. The plurality of communication holes 36b connects each of the gas diffusion chambers 36a and the plurality of gas delivery holes 34a extending below the gas diffusion chamber 36a. The upper electrode 30 having such a configuration constitutes a shower head SH.

In the shower head SH, one gas diffusion chamber 36a and a plurality of gas delivery holes connected to the gas diffusion chamber 36a configures one gas delivery portion. Therefore, the shower head SH provides a plurality of gas delivery portions. A gas can be supplied from the plurality of gas delivery portions toward a plurality of different zones within the processing container 12, that is, toward different regions of the wafer W in a radial direction.

In addition, in the plasma processing apparatus 10, a deposit shield 46 is detachably provided along the inner wall of the processing container 12. The deposit shield 46 is also provided on the outer circumference of the support portion 14. The deposit shield 46 is used for preventing by-products (deposits) of plasma processing from being attached to the processing container 12, and may be formed by covering an aluminum material with ceramics such as Y2O3.

An exhaust plate 48 is provided on the bottom side of the processing container 12, and between the support portion 14 and the sidewall of the processing container 12. The exhaust plate 48 may be formed by covering, for example, an aluminum material with ceramics such as Y2O3. A large number of through-holes are formed in the exhaust plate 48. An exhaust port 12e is provided below the exhaust plate 48 in the processing container 12. An exhaust apparatus 50 and an exhaust apparatus 51 are connected to the exhaust port 12e through an exhaust pipe 52. In an embodiment, the exhaust apparatus 50 is a turbo-molecular pump, and the exhaust apparatus 51 is a dry pump. The exhaust apparatus 50 is provided on an upstream side of the exhaust apparatus 51 with respect to the processing container 12. The exhaust pipe EL of the gas supply system GP1 is connected to a pipe between the exhaust apparatus 50 and the exhaust apparatus 51. The exhaust pipe EL is connected between the exhaust apparatus 50 and the exhaust apparatus 51, and thus the backflow of a gas from the exhaust pipe EL into the processing container 12 is suppressed.

In addition, the plasma processing apparatus 10 further includes a first high-frequency power source 62 and a second high-frequency power source 64. The first high-frequency power source 62 is a power source that generates a first high frequency wave for plasma generation, and generates a high frequency wave having a frequency of 27 to 100 MHz, for example 40 MHz. The first high-frequency power source 62 is connected to the lower electrode LE with a matching device 66 interposed therebetween. The matching device 66 includes a circuit for matching output impedance of the first high-frequency power source 62 with input impedance on the load side (lower electrode LE side).

The second high-frequency power source 64 is a power source that generates a second high frequency wave for attracting ions to the wafer W, that is, a high frequency wave for a bias, and generates a high frequency wave having a frequency in a range of 400 kHz to 13.56 MHz, for example, 3.2 MHz. The second high-frequency power source 64 is connected to the lower electrode LE with a matching device 68 interposed therebetween. The matching device 68 includes a circuit for matching output impedance of the second high-frequency power source 64 with input impedance on the load side (lower electrode LE side).

In addition, in an embodiment, the plasma processing apparatus 10 may further include a control unit Cnt. The control unit Cnt is a computer including a processor, a storage unit, an input apparatus, a display device, and the like. The control unit Cnt controls each portion of the plasma processing apparatus 10 in order to perform plasma processing executed by the plasma processing apparatus 10.

In the plasma processing apparatus 10, it is possible to generate plasma by exciting a gas supplied into the processing container 12. The wafer W can be processed by active species. In addition, different gases can be rapidly switched and supplied into the processing container 12 by the gas supply system GP1. Therefore, it is possible to enhance the throughput of a process of alternately performing different types of plasma processing on the wafer W.

Figure 4:
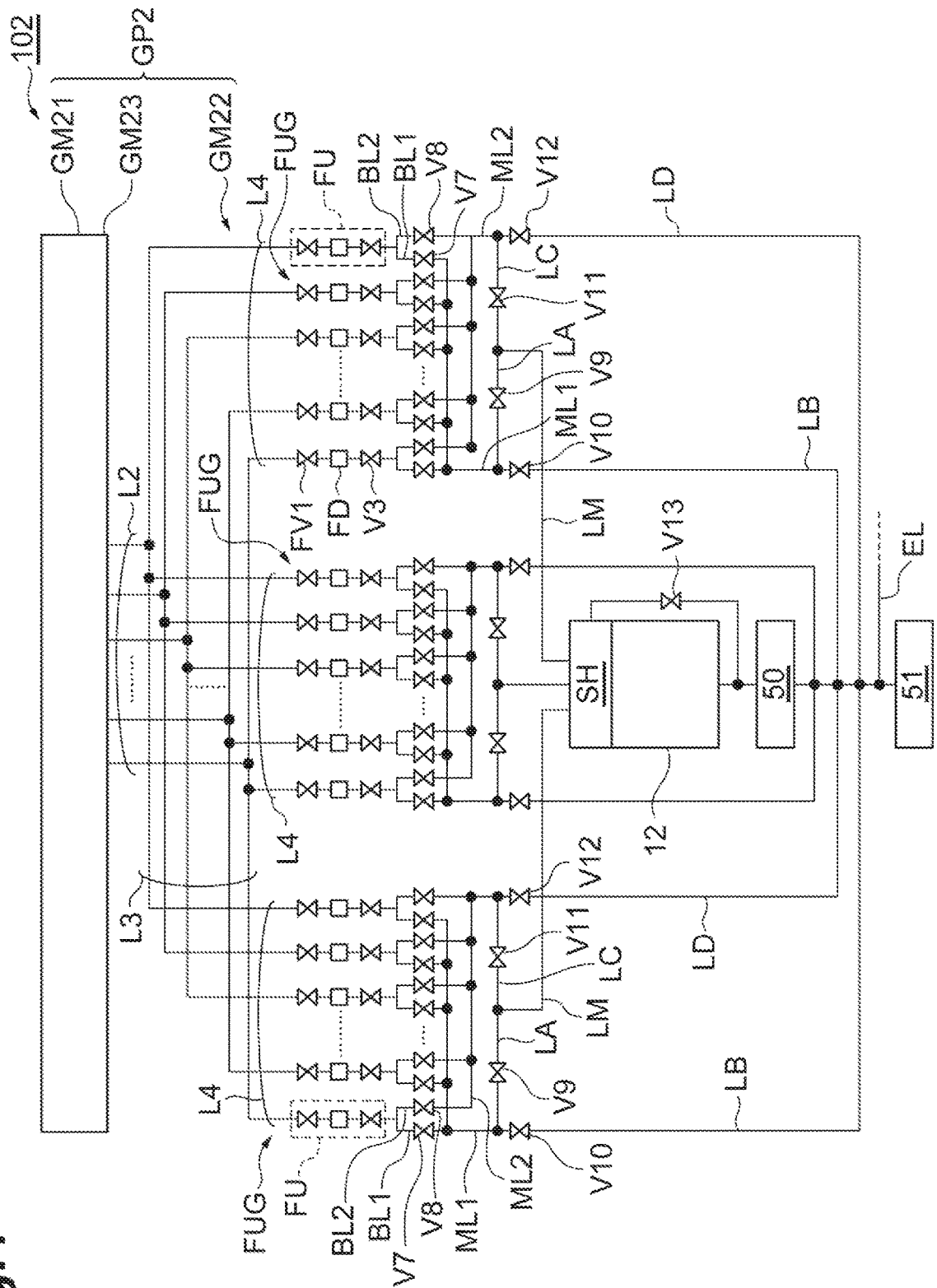
FIG. 4 is a diagram schematically illustrating a plasma processing apparatus according to another embodiment.

Hereinafter, a gas supply system according to another embodiment and a plasma processing apparatus which is an example of the substrate processing apparatus including the gas supply system will be described. FIG. 4 is a diagram schematically illustrating a plasma processing apparatus according to another embodiment. A plasma processing apparatus 102 shown in FIG. 4 includes components other than the gas supply system GP1 of the plasma processing apparatus 10 shown in FIG. 3, that is, the processing container 12, the shower head SH, the exhaust apparatus 50, the exhaust apparatus 51, and the like. Hereinafter, a component including the processing container and the like other than the gas supply system is refers to a reactor unit.

The plasma processing apparatus 102 further includes a gas supply system GP2. The gas supply system GP2 includes a first mechanism GM21, a second mechanism GM22, and a third mechanism GM23. The first mechanism GM21 is different from the first mechanism GM1, only in that the number of integration portions GI of the first mechanism GM21 is larger than the number of integration portions GI of the first mechanism GM1 of the gas supply system GP1. Therefore, as shown in FIG. 4, more second pipes L2 than those of the first mechanisms GM1 extend from the first mechanism GM21.

The third mechanism GM23 is different from the third mechanism GM3 of the gas supply system GP1, in that the third mechanism GM23 includes as many fifth pipes L5 and fifth valves V5 as the number of second pipes L2 of the first mechanism GM21, that is, includes more fifth pipes L5 than the number of fifth pipes L5 of the third mechanism GM3 of the gas supply system GP1, and more fifth valves V5 than the number of fifth valves V5 of the third mechanism GM3. As with the exhaust pipe EL of the third mechanism GM3 of the gas supply system GP1, an exhaust pipe EL of the third mechanism GM23 is connected to a pipe between the exhaust apparatus 50 and the exhaust apparatus 51.

The second mechanism GM22 includes a plurality of flow rate control units groups FUG In the example shown in FIG. 4, the number of flow rate control units groups FUG of the second mechanism GM22 is three, but there is no limitation to this number. Each of the plurality of flow rate control units groups FUG includes a plurality of flow rate control units FU. In the second mechanism GM22, the number of flow rate control units FU included in each flow rate control unit group FUG is larger than the number of flow rate control units FU included in each flow rate control unit group FUG of the gas supply system GP1.

The second mechanism GM22 includes a plurality of branch pipes BL1, a plurality of branch pipes BL2, a plurality of valves V7, a plurality of valves V8, a plurality of merging pipes ML1, and a plurality of merging pipes ML2.

The plurality of branch pipes BL1 are connected to the plurality of fourth pipes L4 on downstream sides of flow rate control units FU, respectively. In addition, the plurality of branch pipes BL2 are also connected to the plurality of fourth pipes L4 on downstream sides of flow rate control units FU, respectively. That is, the branch pipe BL1 and the branch pipe BL2 branch off from each fourth pipe L4, on a downstream side of the flow rate control unit FU. Each branch pipe BL1 is provided with a valve V7, and each branch pipe BL2 is provided with a valve V8.

The plurality of merging pipes ML1 are configured to merge gases from the plurality of branch pipes BL1 of the respective flow rate control unit groups FUG. That is, a plurality of branch pipes BL1 connected to a plurality of flow rate control units FU of one corresponding flow rate control unit group FUG are connected to one merging pipe ML1. In addition, the plurality of merging pipes ML2 are configured to merge gases from the plurality of branch pipes BL2 of the respective flow rate control unit groups FUG. That is, a plurality of branch pipes BL2 connected to a plurality of flow rate control units FU of one corresponding flow rate control unit group FUG are connected to one merging pipe ML2.

In addition, the second mechanism GM22 of the gas supply system GP2 shown in FIG. 4 further includes a plurality of valves V9, a plurality of valves V10, a plurality of valves V11, and a plurality of valves V12.

Each merging pipe ML1 is connected to a corresponding gas delivery portion among the plurality of gas delivery portions of the shower head SH through a valve V9. In addition, each merging pipe ML1 is connected to the pipe between the exhaust apparatus 50 and the exhaust apparatus 51 through a valve V10. That is, each merging pipe ML1 branches into a pipe LA having a valve V9 and a pipe LB having a valve V10. The pipe LA merges into a pipe LM, and the pipe LM is connected to a corresponding gas delivery portion among the plurality of gas delivery portions of the shower head SH. In addition, the pipe LB is connected to the pipe between the exhaust apparatus 50 and the exhaust apparatus 51.

Each merging pipe ML2 is connected to a corresponding gas delivery portion among the plurality of gas delivery portions of the shower head SH through a valve V11. In addition, each merging pipe ML2 is connected to the pipe between the exhaust apparatus 50 and the exhaust apparatus 51 through a valve V12. That is, each merging pipe ML2 branches into a pipe LC having a valve V11 and a pipe LD having a valve V12. The pipe LC merges into a pipe LM together with a pipe LA that guides a gas from the same flow rate control unit group FUG, and the pipe LM is connected to a corresponding gas delivery portion among the plurality of gas delivery portions of the shower head SH. In addition, the pipe LD is connected to the pipe between the exhaust apparatus 50 and the exhaust apparatus 51.

In addition, the plasma processing apparatus 102 may further include a valve V13. The valve V13 is provided in a pipe connected to the shower head SH and the exhaust pipe 52 (see FIG. 3) extending between the processing container 12 and the exhaust apparatus 50. The valve V13 is opened when a gas within the gas supply system GP2 is exhausted. Thereby, a gas within the shower head SH is exhausted to the exhaust apparatus 50. Therefore, the gas within the shower head SH can be exhausted rapidly.

Figure 5:
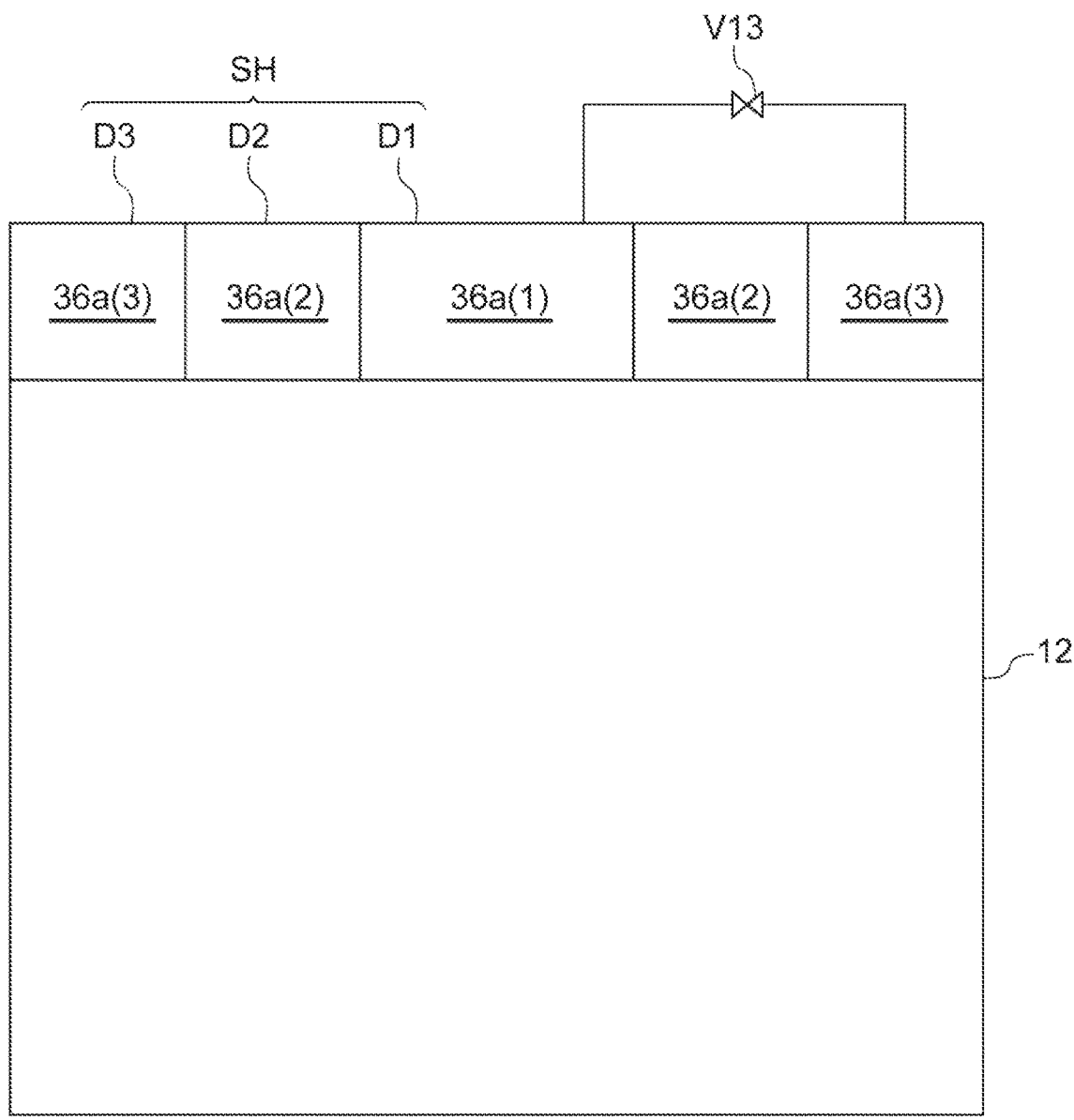
FIG. 5 is a diagram illustrating another embodiment relating to a valve V13.

FIG. 5 is a diagram illustrating another embodiment relating to the valve V13. In the embodiment shown in FIG. 5, the shower head SH includes a plurality of gas delivery portions, for example, a gas delivery portion D1, a gas delivery portion D2, and a gas delivery portion D3. The gas delivery portion D1 includes a gas diffusion chamber $36a(1)$, the gas delivery portion D2 includes a gas diffusion chamber $36a(2)$, and the gas delivery portion D3 includes a gas diffusion chamber $36a(3)$. In this embodiment, the number of gas delivery holes 34a which are connected to the gas diffusion chamber $36a(3)$ is larger than the number of gas delivery holes 34a which are connected to the gas diffusion chamber $36a(1)$. Therefore, the conductance of the gas delivery portion D3 is higher than the conductance of the gas delivery portion D1. In order to rapidly exhaust the gas within such a shower head SH, a pipe having the valve V13 connects the gas delivery portion D1 to the gas delivery portion D3. The valve V13 is opened when a gas within the gas supply system GP2 is exhausted. Accordingly, a gas from the gas delivery portion D1 flows to the gas delivery portion D3, and is rapidly exhausted through a space within the processing container 12.

In the gas supply system GP2 described above, a gas inside a flow channel within the gas supply system GP2 can be replaced rapidly, that is, in a short period of time, as with the gas supply system GP1. In addition, in the gas supply system GP2, by opening one of a valve V7 and a valve V8 which are respectively provided in a pair of branch pipe BL1 and branch pipe BL2 branching from each fourth pipe L4, a gas A from a part of the plurality of flow rate control units FU of each flow rate control unit group FUG can be supplied to the merging pipe ML1, and a gas B from the other part can be supplied to the merging pipe ML2.

According to the plasma processing apparatus 102 including such a gas supply system GP2, the gas A from the plurality of merging pipes ML1 and the gas B from the plurality of merging pipes ML2 can be alternately supplied into the processing container 12, and a gas which is not supplied into the processing container 12 can be caused to flow to the exhaust side. Accordingly, it is possible to rapidly change a gas to be supplied into the processing container 12. The gas A and the gas B in this case are different types of gas. Therefore, it is possible to increase the throughput of a process of alternately performing different types of plasma processing on the wafer W.

Alternatively, according to the plasma processing apparatus 102, the gas A can be continuously supplied from the merging pipe ML1 into the processing container 12, and the gas B from the merging pipe ML2 can be supplied into the processing container 12 intermittently, that is, in a pulsed manner. In this case, the gas from the merging pipe ML2 may be a gas which is different from or the same as the gas from the merging pipe ML1.

Figure 6:
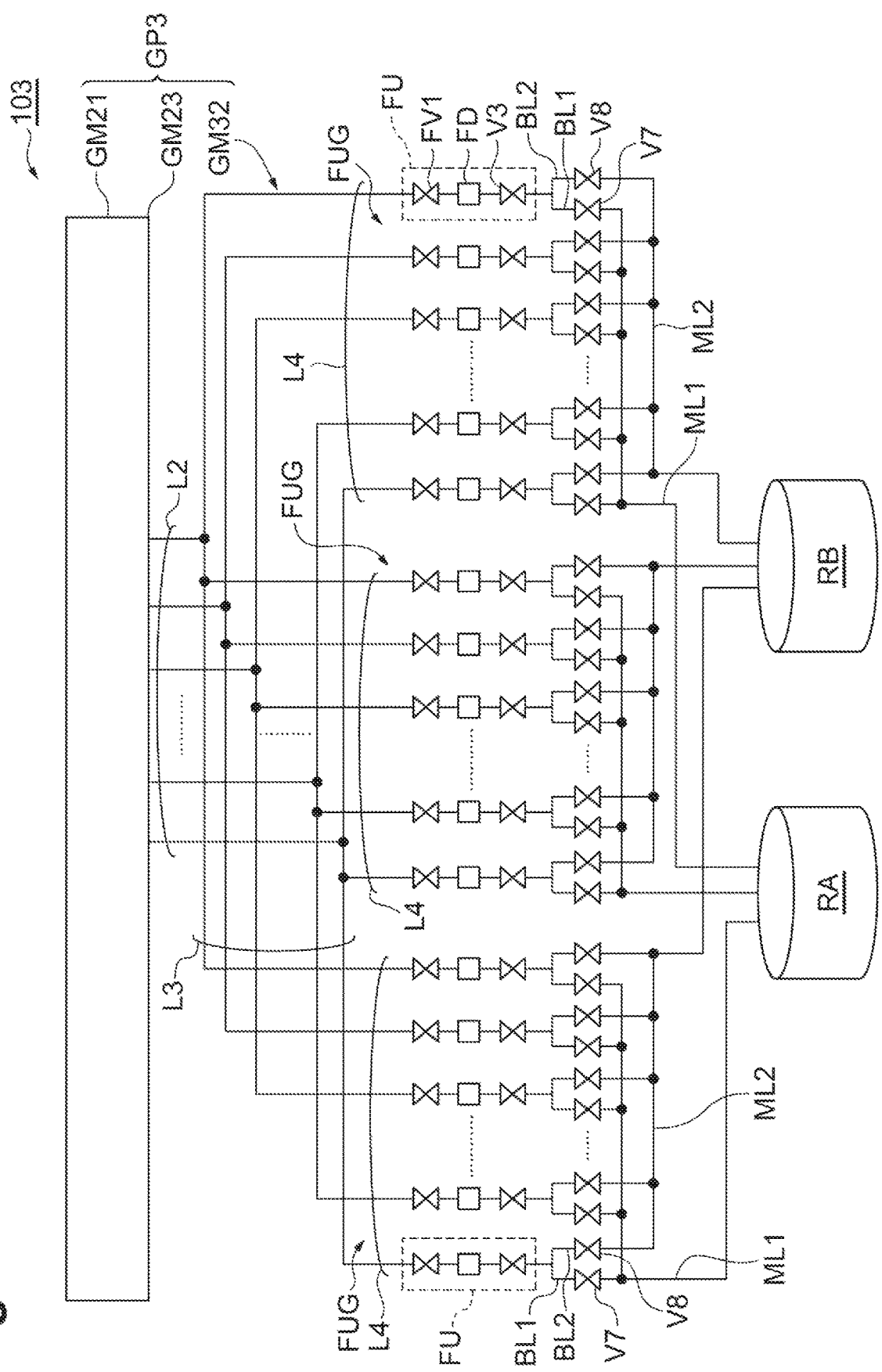
FIG. 6 is a diagram schematically illustrating a plasma processing apparatus according to still another embodiment.

Hereinafter, a plasma processing apparatus of still another embodiment will be described. FIG. 6 is a diagram schematically illustrating a plasma processing apparatus of still another embodiment. A plasma processing apparatus 103 shown in FIG. 6 includes a reactor unit RA and a reactor unit RB. The reactor unit RA and the reactor unit RB are the same reactor units as the reactor units of the plasma processing apparatus 10 and the plasma processing apparatus 102.

The plasma processing apparatus 103 further includes a gas supply system GP3. As with the gas supply system GP2, the gas supply system GP3 includes a first mechanism GM21 and a third mechanism GM23. The gas supply system GP3 further includes a second mechanism GM32. In the plasma processing apparatus 102, the merging pipes ML1 and the merging pipes ML2 of the second mechanism GM22 are connected to the shower head SH of a single reactor unit. However, in the plasma processing apparatus 103, a plurality of merging pipes ML1 of the second mechanism GM32 are connected to a plurality of gas delivery portions of the shower head SH of the reactor unit RA, respectively, and a plurality of merging pipes ML2 are connected to a plurality of gas delivery portions of the shower head SH of the reactor unit RB, respectively.

In addition, in the plasma processing apparatus 103, an exhaust pipe EL of the third mechanism GM23 can be connected to a pipe between the exhaust apparatus 50 and the exhaust apparatus 51 of the reactor unit RA, or a pipe between the exhaust apparatus 50 and the exhaust apparatus 51 of the reactor unit RB.

According to such a plasma processing apparatus 103, the gas A can be supplied from the single gas supply system GP3 into the processing container 12 of the reactor unit RA, and the gas B can be supplied from the single gas supply system into the processing container 12 of the reactor unit RB. The gas A and the gas B may be different types of gas, and may be the same type of gas. In a case where the gas A and the gas B are different types of gas, different kinds of plasma processing can be performed in the reactor unit RA and the reactor unit RB. On the other hand, in a case where the gas A and the gas B are the same type of gas, the same plasma processing can be performed in the reactor unit RA and the reactor unit RB.

Figure 7:
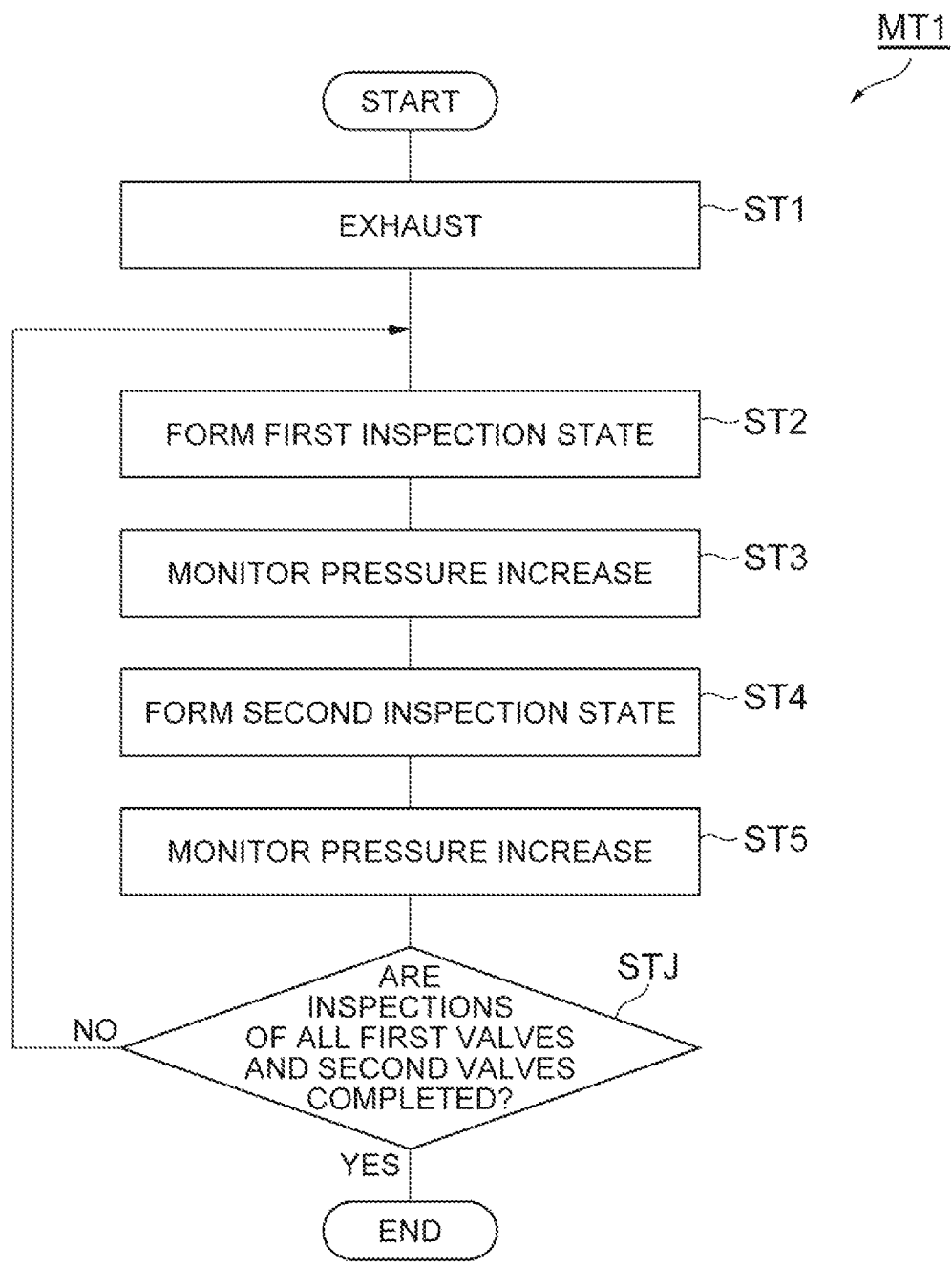
FIG. 7 is a flow diagram illustrating a method for inspecting leaks in valves of a gas supply system according to an embodiment.

Hereinafter, several embodiments of a method for inspecting for leaks in valves of a gas supply system will be described. FIG. 7 is a flow diagram illustrating a method for inspecting leaks in valves of a gas supply system according to an embodiment. A method MT1 shown in FIG. 7 is a method for inspecting leaks in the plurality of first valves V1 and the plurality of second valves V2 in order and individually, and is a method applicable to any of the gas supply system GP1, the gas supply system GP2, and the gas supply system GP3. In addition, the method MT1 may be executed, for example, in an idle period of the substrate processing apparatus in which a process is not executed with respect to a substrate. That is, the method MT1 may be executed in an idle period in which gases from the plurality of gas sources GS are not supplied into the processing container of the substrate processing apparatus.

As shown in FIG. 7, in the method MT1, step ST1 is first executed. In step ST1, evacuation of insides of the plurality of first pipes L1, an inside of the plurality of second pipes L2, an inside of the plurality of third pipes L3, and insides of the plurality of fourth pipes L4 is performed. For this purpose, in step ST1, an exhaust state is formed. The exhaust state is a state in which the respective control valve CV of the plurality of flow rate controllers FD, the plurality of second valves V2, and the fourth valve V4 are opened, and the plurality of first valves V1 and the plurality of third valves V3 are closed. In the exhaust state, the plurality of fifth valves V5 are opened. The valve V6 may be opened or closed. In the exhaust state, gases contained inside of the plurality of first pipes L1, inside of the plurality of second pipes L2, inside of the plurality of third pipes L3, and inside of the plurality of fourth pipes L4 are exhausted by the exhaust apparatus connected to the exhaust pipe EL on a downstream side of the fourth valve V4. Specifically, gases are exhausted which are contained inside of the plurality of first pipes L1 on downstream sides of the plurality of first valves V1, inside of the plurality of second pipes L2, inside of the plurality of third pipes L3, and inside of the fourth pipe L4 on upstream sides of the plurality of third valves V3.

Thereafter, in the method MT1, a sequence including step ST2 to step ST5 is executed with respect to a first valve V1 which is a target for inspection to be selected in order from the plurality of first valves V1, and a second valve V2 which is a target for inspection to be selected in order from the plurality of second valves V2.

In step ST2, a first inspection state is formed. In the first inspection state, the plurality of first valves V1, the plurality of third valves V3, and, the fourth valve V4 are closed. In addition, in the first inspection state, a second valve V2 provided on a downstream side of the first valve V1 which is a target for inspection among the plurality of second valves V2 is opened. In addition, second valves V2 other than the second valve V2 provided on the downstream side of the first valve V1 which is a target for inspection are closed. In the first inspection state, the valve V6 is closed. In addition, when the pressure gauge PM is used in step ST3, a specific fifth valve V5 is opened. The specific fifth valve V5 is a fifth valve V5 provided in the fifth pipe L5 which is connected to a first pipe L1 provided with the first valve V1 which is a target for inspection through a second pipe L2. On the other hand, when the pressure gauge FPM is used in step ST3, the plurality of fifth valves V5 may be closed or opened. In addition, when the pressure gauge PM is used in step ST3, the control valves CV of the plurality of flow rate controllers FD may be opened or closed. On the other hand, when the pressure gauge FPM is used in step ST3, a control valve CV of a flow rate controller FD having the pressure gauge FPM used in step ST3 is opened.

Next, in the method MT1, step ST3 is executed. In step ST3, a pressure increase is monitored for a predetermined time by the pressure gauge FPM. This pressure gauge FPM is a pressure gauge FPM of the flow rate controller FD provided in one fourth pipe L4 which is connected to the first pipe L1 provided with the first valve V1 which is a target for inspection through a second pipe L2 and a third pipe L3. In a case where a pressure increase is not detected in the pressure gauge FPM, it is determined that a leak does not occur in the first valve V1 which is a target for inspection. For example, in a case where a difference between the pressure measured by the pressure gauge FPM when the predetermined time has elapsed and the pressure measured by the pressure gauge FPM in the initial stage of step ST3 is smaller than a predetermined value, it is determined that a leak does not occur in the first valve V1 which is a target for inspection. On the other hand, in a case where a pressure increase is detected in the pressure gauge FPM, it is determined that a leak occurs in the first valve V1 which is a target for inspection. For example, in a case where the difference between the pressure measured by the pressure gauge FPM when the predetermined time has elapsed and the pressure measured by the pressure gauge FPM in the initial stage of step ST3 is equal to or greater than the predetermined value, it is determined that a leak occurs in the first valve V1 which is a target for inspection.

Alternatively, in step ST3, a pressure increase is monitored for a predetermined time by the pressure gauge PM. In a case where a pressure increase is not detected in the pressure gauge PM within this predetermined time, it is determined that a leak does not occur in the first valve V1 which is a target for inspection. For example, in a case where a difference between the pressure measured by the pressure gauge PM when the predetermined time has elapsed and the pressure measured by the pressure gauge PM in the initial stage of step ST3 is smaller than a predetermined value, it is determined that a leak does not occur in the first valve V1 which is a target for inspection. On the other hand, in a case where a pressure increase is detected in the pressure gauge PM, it is determined that a leak occurs in the first valve V1 which is a target for inspection. For example, in a case where the difference between the pressure measured by the pressure gauge PM when the predetermined time has elapsed and the pressure measured by the pressure gauge PM in the initial stage of step ST3 is equal to or greater than the predetermined value, it is determined that a leak occurs in the first valve V1 which is a target for inspection.

In subsequent step ST4, a second inspection state is formed. In the second inspection state, the plurality of second valves V2, the plurality of third valves V3, and the fourth valve V4 are closed. In addition, in the second inspection state, a first valve V1 provided on an upstream side of the second valve V2 which is a target for inspection among the plurality of first valves V1 is opened. In addition, first valves V1 other than the first valve V1 provided on the upstream side of the second valve V2 which is a target for inspection are closed. In the second inspection state, the valve Vb is closed. In addition, when the pressure gauge PM is used in step ST5, a specific fifth valve V5 is opened. The specific fifth valve V5 is a fifth valve V5 provided in a fifth pipe L5 which is connected to a first pipe L1 provided with the second valve V2 which is a target for inspection through a second pipe L2. On the other hand, when the pressure gauge FPM is used in step ST5, the plurality of fifth valves V5 may be closed, or may be opened. In addition, when the pressure gauge PM is used in step ST5, the control valves CV of the plurality of flow rate controllers FD may be opened or closed. On the other hand, when the pressure gauge FPM is used in step ST5, a control valve CV of a flow rate controller FD having the pressure gauge FPM used in step ST5 is opened.

Next, in the method MT1, step ST5 is executed. In step ST5, a pressure increase is monitored for a predetermined time by the pressure gauge FPM. This pressure gauge FPM is a pressure gauge FPM of a flow rate controller FD provided in one fourth pipe L4 which is connected to the first pipe L1 provided with the second valve V2 which is a target for inspection through a second pipe L2 and a third pipe L3. In a case where a pressure increase is not detected in this pressure gauge FPM, it is determined that a leak does not in the second valve V2 which is a target for inspection. For example, in a case where a difference between the pressure measured by the pressure gauge FPM when the predetermined time has elapsed and the pressure measured by the pressure gauge FPM in the initial stage of step ST5 is smaller than a predetermined value, it is determined that a leak does not occur in the second valve V2 which is a target for inspection. On the other hand, in a case where a pressure increase is detected in the pressure gauge FPM, it is determined that a leak occurs in the second valve V2 which is a target for inspection. For example, in a case where the difference between the pressure measured by the pressure gauge FPM when the predetermined time has elapsed and the pressure measured by the pressure gauge FPM in the initial stage of step ST5 is equal to or greater than the predetermined value, it is determined that a leak occurs in the second valve V2 which is a target for inspection.

Alternatively, in step ST5, a pressure increase is monitored for a predetermined time by the pressure gauge PM. In a case where a pressure increase is not detected in the pressure gauge PM within this predetermined time, it is determined that a leak does not occur in the second valve V2 which is a target for inspection. For example, in a case where a difference between the pressure measured by the pressure gauge PM when the predetermined time has elapsed and the pressure measured by the pressure gauge PM in the initial stage of step ST5 is smaller than a predetermined value, it is determined that a leak does not occur in the second valve V2 which is a target for inspection. On the other hand, in a case where a pressure increase is detected in the pressure gauge PM, it is determined that a leak occurs in the second valve V2 which is a target for inspection. For example, in a case where the difference between the pressure measured by the pressure gauge PM when the predetermined time has elapsed and the pressure measured by the pressure gauge PM in the initial stage of step ST5 is equal to or greater than the predetermined value, it is determined that a leak occurs in the second valve V2 which is a target for inspection.

In subsequent step STJ, it is determined whether the inspections of all the first valves V1 and all the second valves V2 are completed. In step STJ, in a case where it is determined that a first valve V1 and a second valve V2 of which the inspections are not completed are present, the first valve V1 and the second valve V2 of which the inspections are not completed are selected as the first valve V1 which is a target for inspection and the second valve V2 which is a target for inspection, and a sequence of step ST2 to step ST5 is executed again. On the other hand, in a case where the inspections of all the first valves V1 and all the second valves V2 are completed, the method MT1 is terminated.

According to the method MT1, leaks in the plurality of first valves V1 and the plurality of second valves V2 which are provided in the plurality of first pipes L1, respectively, can be inspected in order and individually. It should be noted that step ST2 and step ST3 may be executed after the execution of step ST4 and step ST5.

Figure 8:
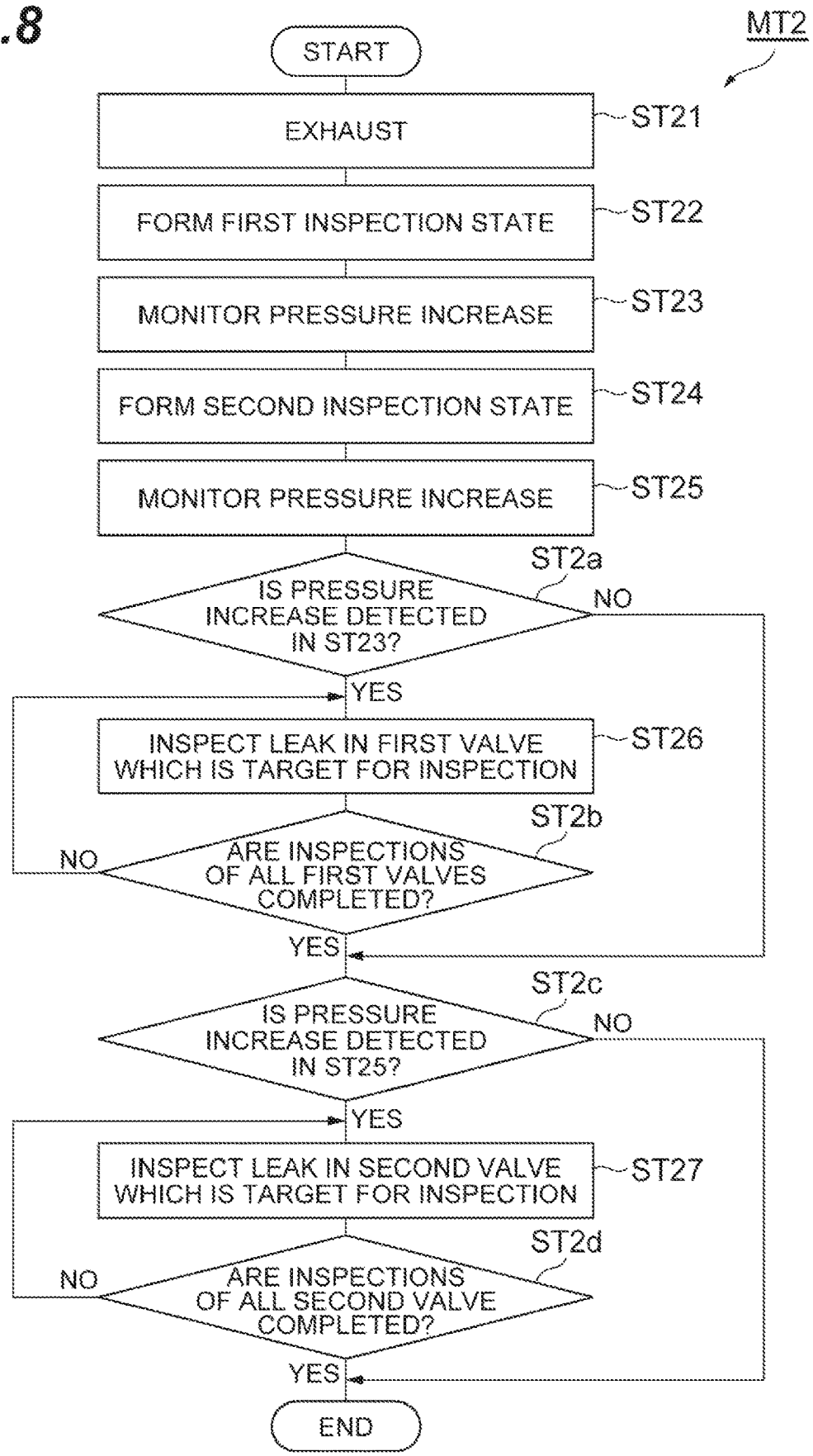
FIG. 8 is a flow diagram illustrating a method for inspecting leaks in valves of a gas supply system according to another embodiment.

Hereinafter, a method for inspecting leaks in valves of a gas supply system according to another embodiment will be described. FIG. 8 is a flow diagram illustrating a method for inspecting leaks in valves of a gas supply system according to another embodiment. A method MT2 shown in FIG. 8 is a method for inspecting leaks in the plurality of first valves V1 simultaneously, and then inspecting leaks in the plurality of first valves V1 in order in a case where a leak occurs in any of the plurality of first valves V1. In addition, the method MT2 is a method for inspecting leaks in the plurality of second valves V2 simultaneously, and then inspecting leaks in the plurality of second valves V2 in order, in a case where a leak occurs in any of the plurality of second valves V2. This method MT2 is a method applicable to any of the gas supply system GP1, the gas supply system GP2, and the gas supply system GP3. In addition, the method MT2 may be executed, for example, in an idle period of the substrate processing apparatus in which a process is not executed with respect to a substrate. That is, the method MT2 may be executed in an idle period in which gases from the plurality of gas sources GS are not supplied into the processing container of the substrate processing apparatus.

As shown in FIG. 8, in the method MT2, step ST21 is first executed. Step ST21 is the same step as step ST1 in the method MT1.

In subsequent step ST22, a first inspection state is formed. In the first inspection state, the plurality of first valves V1, the plurality of third valves V3, and the fourth valve V4 are closed. In addition, in the first inspection state, the plurality of second valves V2 are opened. In the first inspection state, the valve V6 is closed. In addition, when the pressure gauge PM is used in step ST23, the plurality of fifth valves V5 provided in the plurality of fifth pipes L5, respectively, are opened. On the other hand, when the pressure gauges FPM are used in step ST23, the plurality of fifth valves V5 may be closed or opened. In addition, when the pressure gauge PM is used in step ST23, the control valves CV of the plurality of flow rate controllers FD may be opened or closed. On the other hand, when the pressure gauges FPM are used in step ST23, a control valve CV of a flow rate controller FD provided in at least one fourth pipe L4 among the plurality of fourth pipes L4 branching off from each of the third pipes L3 is opened.

Next, in the method MT2, step ST23 is executed. In step ST23, a pressure increase is monitored for a predetermined time by the pressure gauge FPM of the flow rate controller FD provided in one fourth pipe L4 among the plurality of fourth pipes L4 branching off from each of the third pipes L3. In a case where a pressure increase is not detected in any of the pressure gauges FPM used in step ST23, it is determined that leaks do not occur in the plurality of first valves V1. For example, in a case where a difference between the pressure measured by each pressure gauge FPM when the predetermined time has elapsed and the pressure measured by the pressure gauge FPM in the initial stage of step ST23 is smaller than a predetermined value, it is determined that leaks do not occur in the plurality of first valves V1. On the other hand, in a case where a pressure increase is detected in any of the pressure gauges FPM, it is determined that a leak occurs in any of a plurality of first valves V1 included in an integration portion GI provided on an upstream side of a pressure gauge FPM in which a pressure increase is detected. For example, in a case where a difference between the pressure measured by the pressure gauge FPM when the predetermined time has elapsed and the pressure measured by the pressure gauge FPM in the initial stage of step ST23 is equal to or greater than the predetermined value, it is determined that a leak occurs in any of the plurality of first valves V1 included in the integration portion GI provided on an upstream side of the pressure gauge FPM.

Alternatively, in step ST23, a pressure increase is monitored for a predetermined time by the pressure gauge PM. In a case where a pressure increase is not detected in the pressure gauge PM, it is determined that leaks do not occur in the plurality of first valves V1. For example, in a case where a difference between the pressure measured by the pressure gauge PM when the predetermined time has elapsed and the pressure measured by the pressure gauge PM in the initial stage of step ST23 is smaller than a predetermined value, it is determined that leaks do not occur in the plurality of first valves V1. On the other hand, in a case where a pressure increase is detected in the pressure gauge PM, it is determined that a leak occurs in any of the plurality of first valves V1. For example, in a case where the difference between the pressure measured by the pressure gauge PM when the predetermined time has elapsed and the pressure measured by the pressure gauge PM in the initial stage of step ST23 is equal to or greater than the predetermined value, it is determined that a leak occurs in any of the plurality of first valves V1.

In subsequent step ST24, a second inspection state is formed. In this second inspection state, the plurality of second valves V2, the plurality of third valves V3, and the fourth valve V4 are closed. In addition, in the second inspection state, the plurality of first valves V1 are opened. In the second inspection state, the valve V6 is closed. In addition, when the pressure gauge PM is used in step ST25, the plurality of fifth valves V5 provided in the plurality of fifth pipes L5, respectively, are opened. On the other hand, when the pressure gauges FPM are used in step ST25, the plurality of fifth valves V5 may be closed or opened. In addition, when the pressure gauge PM is used in step ST25, the control valves CV of the plurality of flow rate controllers FD may be opened or closed. On the other hand, when the pressure gauges FPM are used in step ST25, a control valve CV of a flow rate controller FD provided in at least one fourth pipe L4 among the plurality of fourth pipes L4 branching off from each of the third pipes L3 is opened.

Next, in the method MT2, step ST25 is executed. In step ST25, a pressure increase is monitored for a predetermined time by the pressure gauge FPM of the flow rate controller FD provided in one fourth pipe L4 among the plurality of fourth pipes L4 branch off from each of the third pipes L3. In a case where a pressure increase is not detected in any of the pressure gauges FPM used in step ST25, it is determined that leaks do not occur in the plurality of second valves V2. For example, in a case where a difference between the pressure measured by each of the pressure gauges FPM when the predetermined time has elapsed and the pressure measured by the pressure gauge FPM in the initial stage of step ST25 is smaller than a predetermined value, it is determined that leaks do not occur in the plurality of second valves V2. On the other hand, in a case where a pressure increase is detected in any of the pressure gauges FPM, it is determined that a leak occurs in any of a plurality of second valves V2 included in an integration portion GI provided on an upstream side of a pressure gauge FPM in which a pressure increase is detected. For example, in a case where a difference between the pressure measured by the pressure gauge FPM when the predetermined time has elapsed and the pressure measured by the pressure gauge FPM in the initial stage of step ST25 is equal to or greater than the predetermined value, it is determined that a leak occurs in any of the plurality of second valves V2 included in the integration portion GI provided on an upstream side of the pressure gauge FPM.

Alternatively, in step ST25, a pressure increase is monitored for a predetermined time by the pressure gauge PM. In a case where a pressure increase is not detected in the pressure gauge PM, it is determined that leaks do not occur in the plurality of second valves V2. For example, in a case where a difference between the pressure measured by the pressure gauge PM when the predetermined time has elapsed and the pressure measured by the pressure gauge PM in the initial stage of step ST25 is smaller than a predetermined value, it is determined that leaks do not occur in the plurality of second valves V2. On the other hand, in a case where a pressure increase is detected in the pressure gauge PM, it is determined that a leak occurs in any of the plurality of second valves V2. For example, in a case where the difference between the pressure measured by the pressure gauge PM when the predetermined time has elapsed and the pressure measured by the pressure gauge PM in the initial stage of step ST25 is equal to or greater than the predetermined value, it is determined that a leak occurs in any of the plurality of second valves V2.

In subsequent step ST2a, it is determined whether a pressure increase is detected in step ST23. In a case where a pressure increase is not detected in step ST23, the flow proceeds to step ST2c. On the other hand, in a case where a pressure increase is detected in step ST23, a leak in the first valve V1 which is a target for inspection to be selected in order from the plurality of first valves V1 is inspected in step ST26.

Specifically, in step ST26, the plurality of first valves V1, the plurality of third valves V3, and the fourth valve V4 are closed. In addition, a second valve V2 provided on a downstream side of the first valve V1 which is a target for inspection among the plurality of second valves V2 is opened. In addition, second valves V2 other than the second valve V2 provided on the downstream side of the first valve V1 which is a target for inspection are closed. The valve V6 is closed. In addition, when the pressure gauge PM is used in step ST26, a specific fifth valve V5 is opened. The specific fifth valve V5 is a fifth valve V5 provided in the fifth pipe L5 which is connected to a first pipe L1 provided with the first valve V1 which is a target for inspection through a second pipe L2. On the other hand, when the pressure gauge FPM is used in step ST26, the plurality of fifth valves V5 may be closed or opened. In addition, when the pressure gauge PM is used in step ST26, the control valves CV of the plurality of flow rate controllers FD may be opened or closed. On the other hand, when the pressure gauge FPM is used in step ST26, at least a control valve CV of a flow rate controller FD having the pressure gauge FPM used in step ST26 is opened.

In step ST26, a pressure increase is monitored for a predetermined time by the pressure gauge FPM. This pressure gauge FPM is a pressure gauge FPM of the flow rate controller FD provided in one fourth pipe L4 which is connected to the first pipe L1 provided with the first valve V1 which is a target for inspection through a second pipe L2 and a third pipe L3. In a case where a pressure increase is not detected in this pressure gauge FPM, it is determined that a leak does not occur in the first valve V1 which is a target for inspection. For example, in a case where a difference between the pressure measured by the pressure gauge FPM when the predetermined time has elapsed and the pressure measured by the pressure gauge FPM in the initial stage of step ST26 is smaller than a predetermined value, it is determined that a leak does not occur in the first valve V1 which is a target for inspection. On the other hand, in a case where a pressure increase is detected in the pressure gauge FPM, it is determined that a leak occurs in the first valve V1 which is a target for inspection. For example, in a case where the difference between the pressure measured by the pressure gauge FPM when the predetermined time has elapsed and the pressure measured by the pressure gauge FPM in the initial stage of step ST26 is equal to or greater than the predetermined value, it is determined that a leak occurs in the first valve V1 which is a target for inspection.

Alternatively, in step ST26, a pressure increase is monitored for a predetermined time by the pressure gauge PM. In a case where a pressure increase is not detected in the pressure gauge PM within this predetermined time, it is determined that a leak does not occur in the first valve V1 which is a target for inspection. For example, in a case where a difference between the pressure measured by the pressure gauge PM when the predetermined time has elapsed and the pressure measured by the pressure gauge PM in the initial stage of step ST26 is smaller than a predetermined value, it is determined that a leak does not occur in the first valve V1 which is a target for inspection. On the other hand, in a case where a pressure increase is detected in the pressure gauge PM, it is determined that a leak occurs in the first valve V1 which is a target for inspection. For example, in a case where the difference between the pressure measured by the pressure gauge PM when the predetermined time has elapsed and the pressure measured by the pressure gauge PM in the initial stage of step ST26 is equal to or greater than the predetermined value, it is determined that a leak occurs in the first valve V1 which is a target for inspection.

In subsequent step ST2b, it is determined whether the inspections of all the first valves V1 are completed. In step ST2b, in a case where it is determined that a first valve V1 of which the inspection is not completed is present, the first valve V1 of which the inspection is not completed is selected as the first valve V1 which is a target for inspection, and step ST26 is executed again. On the other hand, in a case where the inspections of all the first valves V1 are completed, the flow proceeds to step ST2c.

In step ST2c, it is determined whether a pressure increase is detected in step ST25. In a case where a pressure increase is not detected in step ST25, the method MT2 is terminated. On the other hand, in a case where a pressure increase is detected in step ST25, a leak in the second valve V2 which is a target for inspection to be selected in order from the plurality of second valves V2 is inspected in step ST27.

Specifically, in step ST27, the plurality of second valves V2, the plurality of third valves V3, and the fourth valve V4 are closed. In addition, a first valve V1 provided on an upstream side of the second valve V2 which is a target for inspection among the plurality of first valves V1 is opened. In addition, first valves V1 other than the first valve V1 provided on the upstream side of the second valve V2 which is a target for inspection are closed. The valve V6 is closed. In addition, when the pressure gauge PM is used in step ST27, a specific fifth valve V5 is opened. The specific fifth valve V5 is a fifth valve V5 provided in a fifth pipe L5 which is connected to a first pipe L1 provided with the second valve V2 which is a target for inspection through a second pipe L2. On the other hand, when the pressure gauge FPM is used in step ST27, the plurality of fifth valves V5 may be closed or opened. In addition, when the pressure gauge PM is used in step ST27, the control valves CV of the plurality of flow rate controllers FD may be opened or closed. On the other hand, when the pressure gauge FPM is used in step ST27, at least a control valve CV of a flow rate controller FD having the pressure gauge FPM used in step ST27 is opened.

In step ST27, a pressure increase is monitored for a predetermined time by the pressure gauge FPM. This pressure gauge FPM is a pressure gauge FPM of a flow rate controller FD provided in one fourth pipe L4 which is connected to the first pipe L1 provided with the second valve V2 which is a target for inspection through a second pipe L2 and a third pipe L3. In a case where a pressure increase is not detected in this pressure gauge FPM, it is determined that a leak does not occur in the second valve V2 which is a target for inspection. For example, in a case where a difference between the pressure measured by the pressure gauge FPM when the predetermined time has elapsed and the pressure measured by the pressure gauge FPM in the initial stage of step ST27 is smaller than a predetermined value, it is determined that a leak does not occur in the second valve V2 which is a target for inspection. On the other hand, in a case where a pressure increase is detected in the pressure gauge FPM, it is determined that a leak occurs in the second valve V2 which is a target for inspection. For example, in a case where the difference between the pressure measured by the pressure gauge FPM when the predetermined time has elapsed and the pressure measured by the pressure gauge FPM in the initial stage of step ST27 is equal to or greater than the predetermined value, it is determined that a leak occurs in the second valve V2 which is a target for inspection.

Alternatively, in step ST27, a pressure increase is monitored for a predetermined time by the pressure gauge PM. In a case where a pressure increase is not detected in the pressure gauge PM within this predetermined time, it is determined that a leak does not occur in the second valve V2 which is a target for inspection. For example, in a case where a difference between the pressure measured by the pressure gauge PM when the predetermined time has elapsed and the pressure measured by the pressure gauge PM in the initial stage of step ST27 is smaller than a predetermined value, it is determined that a leak does not occur in the second valve V2 which is a target for inspection. On the other hand, in a case where a pressure increase is detected in the pressure gauge PM, it is determined that a leak occurs in the second valve V2 which is a target for inspection. For example, in a case where the difference between the pressure measured by the pressure gauge PM when the predetermined time has elapsed and the pressure measured by the pressure gauge PM in the initial stage of step ST27 is equal to or greater than the predetermined value, it is determined that a leak occurs in the second valve V2 which is a target for inspection.

In subsequent step ST2d, it is determined whether the inspections of all the second valves V2 are completed. In step ST2d, in a case where it is determined that a second valve V2 of which the inspection is not completed is present, the second valve V2 of which the inspection is not completed is selected as the second valve V2 which is a target for inspection, and step ST27 is executed again. On the other hand, in a case where the inspections of all the second valves V2 are completed, the method MT 2 is terminated.

According to this method MT2, leaks in the plurality of first valves V1 are simultaneously inspected. Only in a case where it is determined that a leak occurs in any of the plurality of first valves V1, the inspections of leaks in the plurality of first valves V1 are performed in order and individually. In addition, in the method MT2, leaks in the plurality of second valves V2 are simultaneously inspected. Only in a case where it is determined that a leak occurs in any of the plurality of second valves V2, the inspections of leaks in the plurality of second valves V2 are performed in order and individually. Therefore, in a case where no leaks occur in all the first valves V1, the inspections of leaks in the plurality of first valves V1 are completed in a short period of time. In addition, in a case where no leaks occur in all the second valves V2, the inspections of leaks in the plurality of second valves V2 are completed in a short period of time.

It should be noted that step ST22 and step ST23 may be executed after the execution of step ST24 and step ST25. In addition, immediately after the execution of step ST22 and step ST23, the determination of step ST2a may be performed, and step ST26 and step ST2b may be executed as necessary. In addition, immediately after the execution of step ST24 and step ST25, the determination of step ST2c may be performed, and step ST27 and step ST2d may be executed as necessary. In addition, before the execution of step ST2a, step ST2c may be executed, and step ST27 and step ST2d may be executed as necessary. In addition, step ST26 may be applied to only a plurality of first valves V1 included in an integration portion GI including a first valve V1 in which a leak may occur. In addition, step ST27 may be applied to only a plurality of second valves V2 included in an integration portion GI including a second valve V2 in which a leak may occur.

Figure 9:
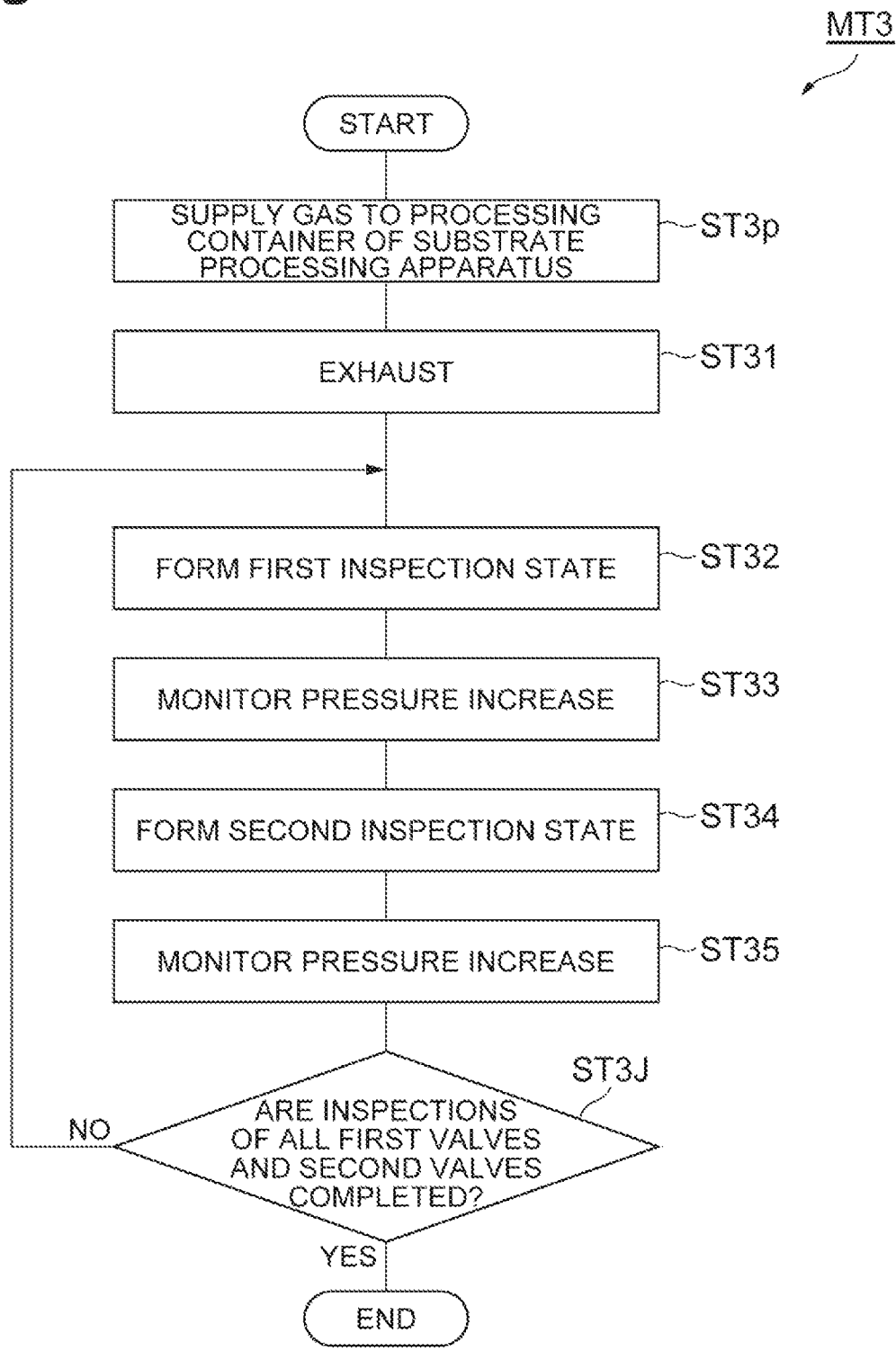
FIG. 9 is a flow diagram illustrating a method for inspecting leaks in valves of a gas supply system according to still another embodiment.

Hereinafter, a method for inspecting leaks in valves of a gas supply system according to still another embodiment will be described. FIG. 9 is a flow diagram illustrating a method for inspecting leaks in valves of a gas supply system according to still another embodiment. In a method MT3 shown in FIG. 9, a gas is supplied from a part of the plurality of integration portions GI into the processing container of the substrate processing apparatus and a process is executed with respect to a substrate within the processing container, while leaks in a plurality of first valves V1 and a plurality of second valves V2 included in an integration portion GI that does not supply a gas into the processing container among the plurality of integration portions GI are inspected. That is, in the method MT3, leaks in the plurality of first valves V1 and the plurality of second valves V2 are inspected in order and individually, while a gas is supplied to the processing container of the substrate processing apparatus through a plurality of other first valves V1 and a plurality of other second valves V2. This method MT3 is a method applicable to any of the gas supply system GP1, the gas supply system GP2, and the gas supply system GP3. Hereinafter, an integration portion GI that supplies a gas into the processing container among the plurality of integration portions GI is called an "integration portion GI for a process", and an integration portion GI that does not supply a gas into the processing container is called an "integration portion GI which is a target for inspection".

In the method MT3, in step ST3p, a gas from the integration portion GI for a process is supplied into the processing container of the substrate processing apparatus. During the execution of step ST3p, a fifth valve V5 provided in a fifth pipe L5 connected to a second pipe L2 of the integration portion GI for a process is closed. The execution of step ST31 to ST35 described later is performed during the execution of step ST3p.

In subsequent step ST31, evacuation of insides of a plurality of first pipes L1 and a second pipe L2 of the integration portion GI which is a target for inspection, an inside of a third pipe L3 connected to the second pipe L2 of the integration portion GI which is a target for inspection, and insides of a plurality of fourth pipes L4 connected to the third pipe L3 is performed. To this end, in step ST31, an exhaust state is formed. The exhaust state is a state in which respective control valves CV of a plurality of flow rate controllers FD provided in the plurality of fourth pipes L4 which are connected to the second pipe L2 of the integration portion GI which is a target for inspection through the third pipe L3, a plurality of second valves V2 of the integration portion GI which is a target for inspection, and the fourth valve V4 are opened, and a plurality of first valves V1 of the integration portion GI which is a target for inspection, and a plurality of third valves V3 provided in the plurality of fourth pipes L4 which are connected to the second pipe L2 of the integration portion GI which is a target for inspection through the third pipe L3 are closed. In the exhaust state, a fifth valve V5 provided in a fifth pipe L5 which is connected to the second pipe L2 of the integration portion GI which is a target for inspection is opened. The valve Vb may be opened, or may be closed.

Thereafter, in the method MT3, a sequence including step ST32 to step ST35 is executed with respect to a first valve V1 which is a target for inspection to be selected in order from the plurality of first valves V1 of the integration portion GI which is a target for inspection, and a second valve V2 which is a target for inspection to be selected in order from the plurality of second valves V2 of the integration portion GI which is a target for inspection.

In step ST32, a first inspection state is formed. In the first inspection state, the plurality of first valves V1 of the integration portion GI which is a target for inspection, the plurality of third valves V3 provided in the plurality of fourth pipes L4 which are connected to the second pipe L2 of the integration portion GI which is a target for inspection through the third pipe L3, and the fourth valve V4 are closed. In addition, in the first inspection state, a second valve V2 provided on a downstream side of the first valve V1 which is a target for inspection is opened. In addition, second valves V2 other than the second valve V2 provided on the downstream side of the first valve V1 which is a target for inspection among the plurality of second valves V2 included in the integration portion GI which is a target for inspection are closed. In the first inspection state, the valve V6 is closed. In addition, when the pressure gauge PM is used in step ST33, a specific fifth valve V5 is opened. The specific fifth valve V5 is a fifth valve V5 provided in the fifth pipe L5 which is connected to a first pipe L1 provided with the first valve V1 which is a target for inspection through a second pipe L2. On the other hand, when the pressure gauge FPM is used in step ST33, the specific fifth valve V5 may be closed or opened. In addition, in a case where the pressure gauge PM is used in step ST33, control valves CV of a plurality of flow rate controllers FD provided on a downstream side of the integration portion GI which is a target for inspection may be opened or closed. On the other hand, when the pressure gauge FPM is used in step ST33, a control valve CV of a flow rate controller FD having the pressure gauge FPM used in step ST33 is opened.

Next, in the method MT3, step ST33 is executed. Step ST33 is the same step as step ST3 in the method MT1.

In subsequent step ST34, a second inspection state is formed. In the second inspection state, the plurality of second valves V2 of the integration portion GI which is a target for inspection, the plurality of third valves V3 provided in the plurality of fourth pipes L4 which are connected to the second pipe L2 of the integration portion GI which is a target for inspection through the third pipe L3, and the fourth valve V4 are closed. In addition, in the second inspection state, a first valve V1 provided on an upstream side of the second valve V2 which is a target for inspection is opened. In addition, first valves V1 other than the first valve provided on the upstream side of the second valve V2 which is a target for inspection among the plurality of first valves V1 of the integration portion GI which is a target for inspection are closed. In the second inspection state, the valve V6 is closed. In addition, when the pressure gauge PM is used in step ST35, a specific fifth valve V5 is opened. The specific fifth valve V5 is a fifth valve V5 provided in a fifth pipe L5 which is connected to a first pipe L1 provided with the second valve V2 which is a target for inspection through a second pipe L2. On the other hand, when the pressure gauge FPM is used in step ST35, the specific fifth valve V5 may be closed or opened. In addition, when the pressure gauge PM is used in step ST35, control valves CV of a plurality of flow rate controllers FD provided on a downstream side of the integration portion GI which is a target for inspection may be opened or closed. On the other hand, when the pressure gauge FPM is used in step ST35, a control valve CV of a flow rate controller FD having the pressure gauge FPM used in step ST35 is opened.

Next, in the method MT3, step ST35 is executed. Step ST35 is the same step as step ST5 in the method MT1.

In subsequent step ST3J, it is determined whether the inspections of all the first valves V1 and all the second valves V2 of the integration portion GI which is a target for inspection are completed. In step ST3J, in a case where it is determined that a first valve V1 and a second valve V2 of which the inspections are not completed are present, the first valve V1 and the second valve V2 of which the inspections are not completed are selected as the first valve V1 which is a target for inspection and the second valve V2 which is a target for inspection, from the plurality of first valves V1 and the plurality of second valves V2 of the integration portion GI which is a target for inspection, and a sequence of step ST32 to step ST35 is executed again. On the other hand, in a case where the inspections of all the first valves V1 and all the second valves V2 of the integration portion GI which is a target for inspection are completed, the method MT3 is terminated.

According to this method MT3, leaks in first valves V1 and second valves V2 of an integration portion GI which is not used in a process performed within the processing container of the substrate processing apparatus can be inspected in order and individually. Therefore, leaks in the first valves V1 and the second valves V2 can be inspected without influencing an operating time for a process in a substrate processing apparatus. It should be noted that step ST32 and step ST33 may be executed after the execution of step ST34 and step ST35.

Figure 10:
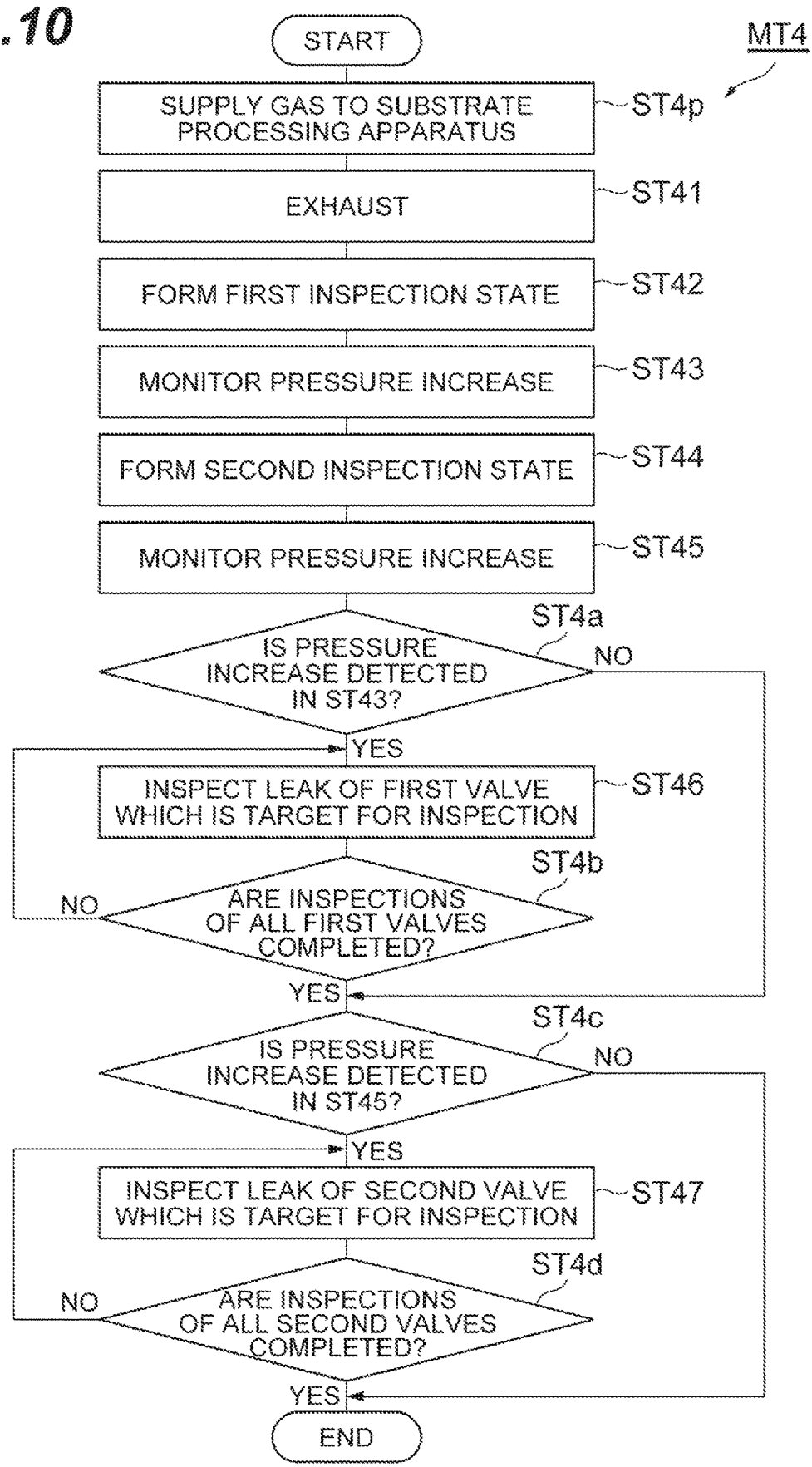
FIG. 10 is a flow diagram illustrating a method for inspecting leaks in valves of a gas supply system according to still another embodiment.

Hereinafter, a method for inspecting leaks in valves of a gas supply system according to still another embodiment will be described. FIG. 10 is a flow diagram illustrating a method for inspecting leaks in valves of a gas supply system according to still another embodiment. In a method MT4 shown in FIG. 10, a gas is supplied from a part of the plurality of integration portions GI into the processing container of the substrate processing apparatus and a process is executed with respect to a substrate within the processing container, while leaks in a plurality of first valves V1 and a plurality of second valves V2 included in an integration portion GI that does not supply a gas into the processing container among the plurality of integration portions GI are inspected. That is, in the method MT4, leaks in the plurality of first valves V1 and the plurality of second valves V2 are inspected, while a gas is supplied to the processing container of the substrate processing apparatus through a plurality of other first valves V1 and a plurality of other second valves V2. Hereinafter, an integration portion GI that supplies a gas into the processing container among the plurality of integration portions GI is called an "integration portion GI for a process", and an integration portion GI that does not supply a gas into the processing container is called an "integration portion GI which is a target for inspection". In addition, the method MT4 is a method for simultaneously inspecting leaks in the plurality of first valves V1 of the integration portion GI which is a target for inspection, and inspecting leaks in the plurality of first valves V1 of the integration portion GI which is a target for inspection in order, in a case where a leak occurs in any of the plurality of first valves V1 of the integration portion GI which is a target for inspection. In addition, the method MT4 is a method for simultaneously inspecting leaks in the plurality of second valves V2 of the integration portion GI which is a target for inspection, and inspecting leaks in the plurality of second valves V2 of the integration portion GI which is a target for inspection in order, in a case where a leak occurs in any of the plurality of second valves V2 of the integration portion GI which is a target for inspection. This method MT4 is a method applicable to any of the gas supply system GP1, the gas supply system GP2, and the gas supply system GP3.

As shown in FIG. 10, in the method MT4, in step ST4p, a gas from the integration portion GI for a process is supplied into the processing container of the substrate processing apparatus. During the execution of step ST4p, a fifth valve V5 provided in a fifth pipe L5 which is connected to a second pipe L2 of the integration portion GI for a process is closed. It should be noted that the execution of step ST41 to ST4d described later is performed during the execution of step ST4p.

Next, in the method MT4, step ST41 is executed. Step ST41 is the same step as step ST31 in the method MT3.

Next, in the method MT4, step ST42 is executed. In step ST42, a first inspection state is formed. In the first inspection state, the plurality of first valves V1 of the integration portion GI which is a target for inspection, the plurality of third valves V3 provided in the plurality of fourth pipes L4 which are connected to the second pipe L2 of the integration portion GI which is a target for inspection through the third pipe L3, and the fourth valve V4 are closed. In addition, in the first inspection state, the plurality of second valves V2 of the integration portion GI which is a target for inspection are opened. In the first inspection state, the valve V6 is closed. In addition, when the pressure gauge PM is used in step ST43, a fifth valve V5 provided in a fifth pipe L5 which is connected to the second pipe L2 of the integration portion GI which is a target for inspection is opened. On the other hand, when the pressure gauge FPM is used in step ST43, the fifth valve V5 provided in the fifth pipe L5 which is connected to the second pipe L2 of the integration portion GI which is a target for inspection may be closed or opened. In addition, when the pressure gauge PM is used in step ST43, control valves CV of a plurality of flow rate controllers FD provided on a downstream side of the integration portion GI which is a target for inspection may be opened or closed. On the other hand, when the pressure gauge FPM is used in step ST43, a control valve CV of at least one flow rate controller FD provided on a downstream side of the integration portion GI which is a target for inspection is opened.

Next, in the method MT4, step ST43 is executed. In step ST43, a pressure increase is monitored for a predetermined time by a pressure gauge FPM of one flow rate controller FD provided on the downstream side of the integration portion GI which is a target for inspection. In a case where a pressure increase is not detected in the pressure gauge FPM, it is determined that leaks do not occur in the plurality of first valves V1 of the integration portion GI which is a target for inspection. For example, in a case where a difference between the pressure measured by the pressure gauge FPM when the predetermined time has elapsed and the pressure measured by the pressure gauge FPM in the initial stage of step ST43 is smaller than a predetermined value, it is determined that leaks do not occur in the plurality of first valves V1 of the integration portion GI which is a target for inspection. On the other hand, in a case where a pressure increase is detected in the pressure gauge FPM, it is determined that a leak occurs in any of the plurality of first valves V1 of the integration portion GI which is a target for inspection. For example, in a case where the difference between the pressure measured by the pressure gauge FPM when the predetermined time has elapsed and the pressure measured by the pressure gauge FPM in the initial stage of step ST43 is equal to or greater than the predetermined value, it is determined that a leak occurs in any of the plurality of first valves V1 of the integration portion GI which is a target for inspection.

Alternatively, in step ST43, a pressure increase is monitored for a predetermined time by the pressure gauge PM. In a case where a pressure increase is not detected in the pressure gauge PM, it is determined that leaks do not occur in the plurality of first valves V1 of the integration portion GI which is a target for inspection. For example, in a case where a difference between the pressure measured by the pressure gauge PM when the predetermined time has elapsed and the pressure measured by the pressure gauge PM in the initial stage of step ST43 is smaller than a predetermined value, it is determined that leaks do not occur generated in the plurality of first valves V1 of the integration portion GI which is a target for inspection. On the other hand, in a case where a pressure increase is detected in the pressure gauge PM, it is determined that a leak occurs in any of the plurality of first valves V1 of the integration portion GI which is a target for inspection. For example, in a case where the difference between the pressure measured by the pressure gauge PM when the predetermined time has elapsed and the pressure measured by the pressure gauge PM in the initial stage of step ST43 is equal to or greater than the predetermined value, it is determined that a leak occurs in any of the plurality of first valves V1 of the integration portion GI which is a target for inspection.

Next, in the method MT4, step ST44 is executed. In step ST44, a second inspection state is formed. In the second inspection state, the plurality of second valves V2 of the integration portion GI which is a target for inspection, the plurality of third valves V3 provided in the plurality of fourth pipes L4 which are connected to the second pipe L2 of the integration portion GI which is a target for inspection through the third pipe L3, and the fourth valve V4 are closed. In addition, in the second inspection state, the plurality of first valves V1 of the integration portion GI which is a target for inspection are opened. In the second inspection state, the valve V6 is closed. In addition, when the pressure gauge PM is used in step ST45, a fifth valve V5 provided in a fifth pipe L5 which is connected to the second pipe L2 of the integration portion GI which is a target for inspection is opened. On the other hand, when the pressure gauge FPM is used in step ST45, the fifth valve V5 provided in the fifth pipe L5 which is connected to the second pipe L2 of the integration portion GI which is a target for inspection may be closed or opened. In addition, when the pressure gauge PM is used in step ST45, control valves CV of a plurality of flow rate controllers FD provided on a downstream side of the integration portion GI which is a target for inspection may be opened or closed. On the other hand, when the pressure gauge FPM is used in step ST45, a control valve CV of at least one flow rate controller FD provided on a downstream side of the integration portion GI which is a target for inspection is opened.

Next, in the method MT4, step ST45 is executed. In step ST45, a pressure increase is monitored for a predetermined time by a pressure gauge FPM of one flow rate controller FD provided on the downstream side of the integration portion GI which is a target for inspection. In a case where a pressure increase is not detected in the pressure gauge FPM, it is determined that leaks do not occur in the plurality of second valves V2 of the integration portion GI which is a target for inspection. For example, in a case where a difference between the pressure measured by the pressure gauge FPM when the predetermined time has elapsed and the pressure measured by the pressure gauge FPM in the initial stage of step ST45 is smaller than a predetermined value, it is determined that leaks do not occur in the plurality of second valves V2 of the integration portion GI which is a target for inspection. On the other hand, in a case where a pressure increase is detected in the pressure gauge FPM, it is determined that a leak occurs in any of the plurality of second valves V2 of the integration portion GI which is a target for inspection. For example, in a case where the difference between the pressure measured by the pressure gauge FPM when the predetermined time has elapsed and the pressure measured by the pressure gauge FPM in the initial stage of step ST45 is equal to or greater than the predetermined value, it is determined that a leak occurs in any of the plurality of second valves V2 of the integration portion GI which is a target for inspection.

Alternatively, in step ST45, a pressure increase is monitored for a predetermined time by the pressure gauge PM. In a case where a pressure increase is not detected in the pressure gauge PM, it is determined that leaks do not occur in the plurality of second valves V2 of the integration portion GI which is a target for inspection. For example, in a case where a difference between the pressure measured by the pressure gauge PM when the predetermined time has elapsed and the pressure measured by the pressure gauge PM in the initial stage of step ST45 is smaller than a predetermined value, it is determined that leaks do not occur generated in the plurality of second valves V2 of the integration portion GI which is a target for inspection. On the other hand, in a case where a pressure increase is detected in the pressure gauge PM, it is determined that a leak occurs in any of the plurality of second valves V2 of the integration portion GI which is a target for inspection. For example, in a case where the difference between the pressure measured by the pressure gauge PM when the predetermined time has elapsed and the pressure measured by the pressure gauge PM in the initial stage of step ST45 is equal to or greater than the predetermined value, it is determined that a leak occurs in any of the plurality of second valves V2 of the integration portion GI which is a target for inspection.

In subsequent step ST4a, it is determined whether a pressure increase is detected in step ST43. In a case where a pressure increase is not detected in step ST43, the flow proceeds to step ST4c. On the other hand, in a case where a pressure increase is detected in step ST43, a leak in the first valve V1 which is a target for inspection to be selected in order from the plurality of first valves V1 of the integration portion GI which is a target for inspection is inspected in step ST46.

Specifically, in step ST46, the plurality of first valves V1 of the integration portion GI which is a target for inspection, the plurality of third valves V3 provided in the fourth pipe L4 which is connected to the second pipe L2 of the integration portion GI which is a target for inspection through the third pipe, and the fourth valve V4 are closed. In addition, a second valve V2 provided on a downstream side of the first valve V1 which is a target for inspection is opened. In addition, second valves V2 other than the second valve V2 provided on the downstream side of the first valve V1 which is a target for inspection among the plurality of second valves V2 of the integration portion GI which is a target for inspection are closed. The valve V6 is closed. In addition, when the pressure gauge PM is used in step ST46, a specific fifth valve V5 is opened. The specific fifth valve V5 is a fifth valve V5 provided in the fifth pipe L5 which is connected to a first pipe L1 provided with the first valve V1 which is a target for inspection through a second pipe L2. On the other hand, when the pressure gauge FPM is used in step ST46, the specific fifth valve V5 may be closed or opened. In addition, when the pressure gauge PM is used in step ST46, control valves CV of a plurality of flow rate controllers FD provided on a downstream side of the integration portion GI which is a target for inspection may be opened or closed. On the other hand, when the pressure gauge FPM is used in step ST46, at least a control valve CV of a flow rate controller FD having the pressure gauge FPM used in step ST46 is opened.

In step ST46, a pressure increase is monitored as with step ST26 in the method MT2, and the presence or absence of occurrence of a leak in the first valve V1 which is a target for inspection is detected.

In subsequent step ST4b, it is determined whether the inspections of all the first valves V1 of the integration portion GI which is a target for inspection are completed. In step ST4b, in a case where it is determined that a first valve V1 of which the inspection is not completed is present, the first valve V1 of which the inspection is not completed is selected as the first valve V1 which is a target for inspection, and step ST46 is executed again. On the other hand, in a case where the inspections of all the first valves V1 of the integration portion GI which is a target for inspection are completed, the flow proceeds to step ST4c.

In step ST4c, it is determined whether a pressure increase is detected in step ST45. In a case where a pressure increase is not detected in step ST45, the method MT4 is terminated. On the other hand, in a case where a pressure increase is detected in step ST45, a leak in the second valve V2 which is a target for inspection to be selected in order from the plurality of second valves V2 of the integration portion GI which is a target for inspection is inspected in step ST47.

Specifically, in step ST47, the plurality of second valves V2 of the integration portion GI which is a target for inspection, the plurality of third valves V3 provided in the plurality of fourth pipes L4 which are connected to the second pipe L2 of the integration portion GI which is a target for inspection through the third pipe L3, and the fourth valve V4 are closed. In addition, in the second inspection state, a first valve V1 provided on an upstream side of the second valve V2 which is a target for inspection is opened. In addition, first valves V1 other than the first valve V1 provided on the upstream side of the second valve V2 which is a target for inspection among the plurality of first valves V1 of the integration portion GI which is a target for inspection are closed. In the second inspection state, the valve V6 is closed. In addition, when the pressure gauge PM is used in step ST47, a specific fifth valve V5 is opened. The specific fifth valve V5 is a fifth valve V5 provided in a fifth pipe L5 which is connected to a first pipe L1 provided with the second valve V2 which is a target for inspection through a second pipe L2. On the other hand, when the pressure gauge FPM is used in step ST47, the specific fifth valve V5 may be closed or opened. In addition, when the pressure gauge PM is used in step ST47, control valves CV of a plurality of flow rate controllers FD provided on a downstream side of the integration portion GI which is a target for inspection may be opened or closed. On the other hand, when the pressure gauge FPM is used in step ST47, at least a control valve CV of a flow rate controller FD having the pressure gauge FPM used in step ST47 is opened.

In step ST47, a pressure increase is monitored as with step ST27 in the method MT2, the presence or absence of occurrence of a leak in the second valve V2 which is a target for inspection is detected.

In subsequent step ST4d, it is determined whether the inspections of all the second valves V2 of the integration portion GI which is a target for inspection are completed. In step ST4d, in a case where it is determined that a second valve V2 of which the inspection is not completed is present, the second valve V2 of which the inspection is not completed is selected as the second valve V2 which is a target for inspection, step ST47 is executed again. On the other hand, in a case where the inspections of all the second valves V2 of the integration portion GI which is a target for inspection are completed, the method MT4 is terminated.

According to this method MT4, it is possible to inspect leaks in first valves V1 and second valves V2 of an integration portion GI which is not used in a process performed within the processing container of the substrate processing apparatus. Therefore, leaks in the first valves V1 and the second valves V2 can be inspected without influencing an operating time for a substrate processing apparatus process. In addition, leaks in the plurality of first valves V1 are simultaneously inspected. Only in a case where it is determined that a leak occurs in any of the plurality of first valves V1, the inspections of leaks in the plurality of first valves V1 are performed in order and individually. In addition, leaks in the plurality of second valves V2 are simultaneously inspected. Only in a case where it is determined that a leak occurs in any of the plurality of second valves V2, the inspections of leaks in the plurality of second valves V2 are performed in order and individually. Therefore, in a case where no leaks occur in all the first valves V1 of the integration portion GI which is a target for inspection, the leak inspection is completed in a short period of time. In addition, in a case where no leaks occur in all the second valves V2 of the integration portion GI which is a target for inspection, the inspections of leaks in the plurality of second valves V2 are completed in a short period of time.

It should be noted that step ST42 and step ST43 may be executed after the execution of step ST44 and step ST45. In addition, immediately after the execution of step ST42 and step ST43, the determination of step ST4a may be performed, and step ST46 and step ST4b may be executed as necessary. In addition, immediately after the execution of step ST44 and step ST45, the determination of step ST4c may be performed, and step ST47 and step ST4d may be executed as necessary. In addition, before the execution of step ST4a, step ST4c may be executed, and step ST47 and step ST4d may be executed as necessary. In addition, step ST46 may be applied to only a plurality of first valves V1 included in an integration portion GI including a first valve V1 in which a leak may occur. In addition, step ST47 may be applied to only a plurality of second valves V2 included in an integration portion GI including a second valve V2 in which a leak may occur.

As stated above, various embodiments have been described, but various modifications can be made without being limited to the above-described embodiments. For example, the above-described substrate processing apparatus is a capacitive coupling type plasma processing apparatus, but the substrate processing apparatus may be an arbitrary plasma processing apparatus such as an inductively coupled plasma processing apparatus, or a plasma processing apparatus using surface waves such as micro waves.

REFERENCE SIGNS LIST

10, 102, 103: plasma processing apparatus, 12: processing container, 30: upper electrode, PD: mounting pedestal, 50: exhaust apparatus, 51: exhaust apparatus, SH: shower head, D1, D2, D3: gas delivery portion, GP1, GP2, GP3: gas supply system, GM1, GM21: first mechanism, GM2, GM22, GM32: second mechanism, GM3, GM23: third mechanism, GI: integration portion, L1: first pipe, L2: second pipe, L3: third pipe, L4: fourth pipe, L5: fifth pipe, EL: exhaust pipe, V1: first valve, V2: second valve, V3: third valve, V4: fourth valve, V5: fifth valve, FUG: flow rate control unit group, FU: flow rate control unit, FD: flow rate controller, FPM: pressure gauge, CV: control valve, FV1: valve, GS: gas source, GSP: source, PM: pressure gauge

The invention claimed is:

1. A method for inspecting leaks in valves of a gas supply system for supplying a gas to a processing container of a substrate processing apparatus,
wherein the gas supply system includes
a plurality of first pipes connected to a plurality of gas sources, respectively,
a plurality of first valves provided in the plurality of first pipes, respectively,
a plurality of second valves provided in the plurality of first pipes on a downstream sides with respect to the plurality of first valves, respectively,
a second pipe connected to the plurality of first pipes on downstream sides of the plurality of second valves,
a third pipe connected to the second pipe,
a plurality of fourth pipes branching off from the third pipe,
a plurality of flow rate controllers provided in the plurality of fourth pipes, respectively,
a plurality of third valves provided in the plurality of fourth pipes on downstream sides of the flow rate controllers, respectively,
an exhaust pipe connected to an exhaust apparatus,
a fourth valve provided in the exhaust pipe, and
a fifth pipe connected to the exhaust pipe on an upstream side of the exhaust apparatus and the fourth valve, and connected to the second pipe,
the method comprising:
a first step of performing evacuation of insides of the plurality of first pipes, an inside of the second pipe, an inside of the third pipe, and insides of the plurality of fourth pipes, an exhaust state being formed in which respective control valves of the plurality of flow rate controllers, the plurality of second valves, and the fourth valve are opened, and the plurality of first valves and the plurality of third valves are closed;
a second step of forming a first inspection state in which the plurality of first valves, the plurality of third valves, and the fourth valve are closed, and one or more second valves among the plurality of second valves or the plurality of second valves are opened;
a third step of monitoring a pressure increase using a pressure gauge provided in the exhaust pipe on an upstream side of the exhaust apparatus and the fourth valve, or a pressure gauge of one flow rate controller among the plurality of flow rate controllers;
a fourth step of forming a second inspection state in which the plurality of second valves, the plurality of third valves, and the fourth valve are closed, and one or more first valves provided on an upstream side of the one or more second valves among the plurality of first valves or the plurality of first valves are opened; and
a fifth step of monitoring a pressure increase using the pressure gauge provided in the exhaust pipe on the upstream side of the exhaust apparatus and the fourth valve, or a pressure gauge of one flow rate controller among the plurality of flow rate controllers.

2. The method according to claim 1,
wherein the gas supply system further includes
a plurality of other first pipes connected to a plurality of other gas sources, respectively,
a plurality of other first valves provided in a plurality of other first pipes, respectively,
a plurality of other second valves provided in the plurality of other first pipes on downstream sides with respect to the plurality of other first valves, respectively,
an other second pipe connected to the plurality of other first pipes on downstream sides of the plurality of other second valves,
an other third pipe connected to the other second pipe,
a plurality of other fourth pipes branching off from the other third pipe,
a plurality of other flow rate controllers provided in the plurality of other fourth pipes, respectively,
a plurality of other third valves provided in the plurality of other fourth pipes on downstream sides of the plurality of other flow rate controllers, respectively,
an other fifth pipe connected to the exhaust pipe on the upstream side of the exhaust apparatus and the fourth valve, and connected to the other second pipe,
a fifth valve provided in the fifth pipe, and
an other fifth valve provided in the other fifth pipe,
the method further comprising a step of supplying a gas from one or more gas sources among the plurality of other gas sources to the substrate processing apparatus, in a state where the other fifth valve is closed,
wherein the first step, the second step, the third step, the fourth step, and the fifth step are executed during the execution of the step of supplying a gas to the substrate processing apparatus.

3. The method according to claim 1, wherein the plurality of second valves are opened in the first inspection state formed in the second step, and the plurality of first valves are opened in the second inspection state formed in the fourth step.

4. The method according to claim 3, further comprising a step of inspecting a leak in a first valve which is a target for inspection to be selected in order from the plurality of first valves, in a case where a pressure increase is detected in the third step,
wherein the step of a leak in a first valve which is a target for inspection includes monitoring a pressure increase using the pressure gauge provided in the exhaust pipe on the upstream side of the exhaust apparatus and the fourth valve, or a pressure gauge of one flow rate controller among the plurality of flow rate controllers, in a state where the plurality of first valves, the plurality of third valves, the fourth valve, and second valves other than a second valve provided on a downstream side of the first valve which is a target for inspection among the plurality of second valves are closed.

5. The method according to claim 3, further comprising a step of inspecting a leak in a second valve which is a target for inspection to be selected in order from the plurality of second valves, in a case where a pressure increase is detected in the fifth step,
wherein the step of inspecting a leak in a second valve which is a target for inspection includes monitoring a pressure increase using the pressure gauge provided in the exhaust pipe on the upstream side of the exhaust apparatus and the fourth valve, or a pressure gauge of one flow rate controller among the plurality of flow rate controllers, in a state where the plurality of second valves, the plurality of third valves, the fourth valve, and first valves other than a first valve provided on an upstream side of the second valve which is a target for inspection among the plurality of first valves are closed.

* * * * *